(12) United States Patent
Mueller et al.

(10) Patent No.: US 12,379,676 B2
(45) Date of Patent: Aug. 5, 2025

(54) PACKAGE IMAGING FOR DIE LOCATION CORRECTION IN DIGITAL LITHOGRAPHY

(71) Applicant: Applied Materials, Inc., Santa Clara, CA (US)

(72) Inventors: Ulrich Mueller, Berkeley, CA (US); Hsiu-Jen Wang, Taichung (TW); Shih-Hao Kuo, Hsinchu (TW); Jang Fung Chen, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 409 days.

(21) Appl. No.: 17/693,356

(22) Filed: Mar. 12, 2022

(65) Prior Publication Data

US 2023/0288822 A1    Sep. 14, 2023

(51) Int. Cl.
*G03F 9/00* (2006.01)
*G01B 11/27* (2006.01)
*G03F 7/00* (2006.01)

(52) U.S. Cl.
CPC .......... *G03F 9/7015* (2013.01); *G01B 11/272* (2013.01); *G03F 7/70441* (2013.01)

(58) Field of Classification Search
CPC ............... G03F 9/7015; G03F 7/70441; G03F 7/70508; G03F 7/70291; G03F 9/7003; G01B 11/272
See application file for complete search history.

(56) References Cited

U.S. PATENT DOCUMENTS

| | | | |
|---|---|---|---|
| 9,648,795 B2 | 5/2017 | Gustafsson et al. | |
| 10,719,018 B2 * | 7/2020 | Chen | G03F 7/70291 |
| 10,948,834 B2 * | 3/2021 | Chen | G03F 7/703 |
| 2016/0150191 A1 * | 5/2016 | Karsenti | H04L 67/306 |
| | | | 382/149 |
| 2016/0351528 A1 | 12/2016 | Takahashi et al. | |

(Continued)

FOREIGN PATENT DOCUMENTS

| | | |
|---|---|---|
| CN | 102063015 A | 5/2011 |
| TW | 201928541 A | 7/2019 |
| TW | 202205370 A | 2/2022 |

OTHER PUBLICATIONS

Application No. PCT/US2023/014613, International Search Report and Written Opinion, Mailed On Jun. 26, 2023, 8 pages.

*Primary Examiner* — Jonathan M Hansen
(74) *Attorney, Agent, or Firm* — Kilpatrick Townsend & Stockton LLP

(57) ABSTRACT

Actual physical locations of dies on a substrate package may be identified without using a full metrology scan of the substrate. Instead, one or more cameras may be used to efficiently locate the approximate location of any of the alignment features based on their expected positioning in the design file for the packages are substrate. The cameras may then be moved to locations where alignment features should be, and images may be captured to determine the actual location of the alignment feature. These actual locations of the alignment features may then be used to identify coordinates for the dies, as well as rotations and/or varying heights of the dies on the packages. A difference between the expected location from the design file and the actual physical location may be used to adjust instructions for the digital lithography system to compensate for the misalignment of the dies.

20 Claims, 13 Drawing Sheets

(56) References Cited

U.S. PATENT DOCUMENTS

| | | | |
|---|---|---|---|
| 2017/0018064 A1* | 1/2017 | Seidel | G06T 7/001 |
| 2018/0090296 A1* | 3/2018 | Neil | H01J 37/20 |
| 2019/0200495 A1 | 6/2019 | Lu | |
| 2019/0234887 A1* | 8/2019 | Kaizerman | G01N 21/9501 |
| 2020/0019065 A1* | 1/2020 | Chen | G03F 7/7065 |
| 2020/0105629 A1 | 4/2020 | Chen et al. | |
| 2020/0132447 A1* | 4/2020 | Bijnen | G01B 11/272 |
| 2020/0333711 A1* | 10/2020 | Chen | G03F 9/7003 |
| 2021/0088916 A1 | 3/2021 | Sallak | |
| 2021/0116825 A1* | 4/2021 | Van Hoof | G03F 7/70625 |
| 2021/0312656 A1* | 10/2021 | Eyring | G06T 7/74 |
| 2021/0341849 A1 | 11/2021 | Hollerbach et al. | |
| 2022/0012405 A1* | 1/2022 | Oron | H05K 3/0005 |
| 2023/0408932 A1* | 12/2023 | Coskun | G03F 9/7003 |

* cited by examiner

PACKAGE IMAGING FOR DIE LOCATION CORRECTION IN DIGITAL LITHOGRAPHY

TECHNICAL FIELD

This disclosure generally relates to lithography systems. More particularly, this disclosure describes a camera system used to correct die placements in a package before depositing traces with digital lithography.

BACKGROUND

Digital lithography is widely used in the manufacturing of semiconductor devices, such as back-end processing of semiconductor devices, liquid crystal displays (LCDs), and light emitting diode (LED) displays. For example, large area substrates are often utilized in the manufacture of LCDs or flat panel displays, are which are commonly used for active matrix displays, such as computers, touch panel devices, personal digital assistants (PDAs), cell phones, television monitors, and the like. Generally, flat panel displays include a layer of liquid crystal material as a phase change material at each pixel, sandwiched between two plates. When power from a power supply is applied across or through the liquid crystal material, an amount of light passing through the liquid crystal material is controlled, i.e., selectively modulated, at the pixel locations enabling images to be generated on the display.

A conventional digital lithography system utilizes may utilize one or more image projection systems. Each image projection system is configured to project one or more write beams into a photoresist layer on a surface of the substrate. Each image projection system projects one or more write beams to the surface of the substrate. A pattern, also known as a mask pattern, is written into the photoresist layer on the surface of the substrate by a write beam projected by the projection lens system. Microlithography techniques have been employed to create electrical features incorporated as part of the liquid crystal material layer forming the pixels. According to these techniques, a light-sensitive photoresist is applied to at least one surface of the substrate. Then, a pattern generator exposes selected areas of the light-sensitive photoresist as part of a pattern with light to cause chemical changes to the photoresist in the selective areas to prepare these selective areas for subsequent material removal and/or material addition processes to create the electrical features.

SUMMARY

In some embodiments, a system may include a first semiconductor processing station including one or more cameras and a first controller configured to perform first operations including receiving first locations for a plurality of dies on a substrate from a design file of the substrate; causing the one or more cameras to capture images of the plurality of dies at the first locations; determining, based on the images of the dies at the first locations, second locations for the plurality of dies associated with actual locations of the plurality of dies on the substrate; and determining differences between the first locations and the second locations. The system may also include a second semiconductor processing station configured to receive the substrate after images are captured by the first semiconductor processing station. The second semiconductor processing station may include a digital lithography system and a second controller configured to perform second operations including generating or adjusting instructions for the digital lithography system to compensate for the differences between the first locations and the second locations; and causing the digital lithography system to execute a digital lithography process on the substrate using the instructions.

In some embodiments, one or more non-transitory computer-readable media may include instructions that, when executed by one or more processors, cause the one or more processors to perform operations including receiving first locations for a plurality of dies on a substrate from a design file of the substrate; causing one or more cameras to capture images of the plurality of dies at the first locations; determining, based on the images of the dies at the first locations, second locations for the plurality of dies associated with actual locations of the plurality of dies on the substrate; determining differences between the first locations and the second locations; and causing instructions for a digital lithography station to be generated or adjusted to compensate for the differences between the first locations and the second locations.

In some embodiments, a method of adjusting digital lithography to compensate for die placement errors may include receiving first locations for a plurality of dies on a substrate from a design file of the substrate; causing one or more cameras to capture images of the plurality of dies at the first locations; determining, based on the images of the dies at the first locations, second locations for the plurality of dies associated with actual locations of the plurality of dies on the substrate; determining differences between the first locations and the second locations; and causing instructions for a digital lithography station to be generated or adjusted to compensate for the differences between the first locations and the second locations.

In any embodiments, any and all of the following features may be implemented in any combination and without limitation. The one or more cameras may include a plurality of cameras. The first operations may further include receiving a number of dies in rows on the substrate; and causing the plurality of cameras to be spaced such that the plurality of cameras are arranged in rows and spaced based on the number of dies in the rows on the substrate. The first operations may further include receiving a number of dies in columns on the substrate; and causing the plurality of cameras to be spaced such that the plurality of cameras are also arranged in columns and spaced based on the number of dies in the columns on the substrate. The system may further include a robotic arm that moves the substrate between the first semiconductor processing station and the second semiconductor processing station. The system may further include one or more displacement sensors located with the one or more cameras that may be configured to measure a distance between the one or more cameras and the substrate at the locations where the one or more cameras capture the images of the plurality of dies at the first locations. The first operations may further include determining the distance between the one or more cameras and the substrate; and adjusting a focus of the one or more cameras based on the distance. The differences between the first locations and the second locations of the plurality of dies may result from a misalignment when the plurality of dies are adhered to the substrate. The first locations may include expected locations of alignment features on the plurality of dies. The second locations may include actual locations of the alignment features on the plurality of dies after being mounted to a substrate. The one or more cameras may include one or more lines scan cameras configured to perform a line scan capture of the images of the dies. The images of the dies may include a line scan along lines where the first locations indicate locations of alignment features on the plurality of dies. The method/operations may also include causing the one or more cameras to capture images of one or more global alignment features on the substrate to align the substrate. The first locations may indicate a bevel edge or die corner of one of the plurality of dies. The method/operations may also include updating a universal metrology file with X/Y coordinates of the actual locations of the plurality of dies on the substrate. An image in the images of the plurality of dies may include a field of view that captures a plurality of the first locations in the image. The method/operations may also include maximizing fields of view of the one or more cameras such that a resolution of the one or more cameras is still able to accurately identify the second locations. The one or more cameras may include a plurality of cameras that are spaced based on fields of view of the plurality of cameras.

BRIEF DESCRIPTION OF THE DRAWINGS

A further understanding of the nature and advantages of various embodiments may be realized by reference to the remaining portions of the specification and the drawings, wherein like reference numerals are used throughout the several drawings to refer to similar components. In some instances, a sub-label is associated with a reference numeral to denote one of multiple similar components. When reference is made to a reference numeral without specification to an existing sub-label, it is intended to refer to all such multiple similar components.

DETAILED DESCRIPTION

Figure 1:
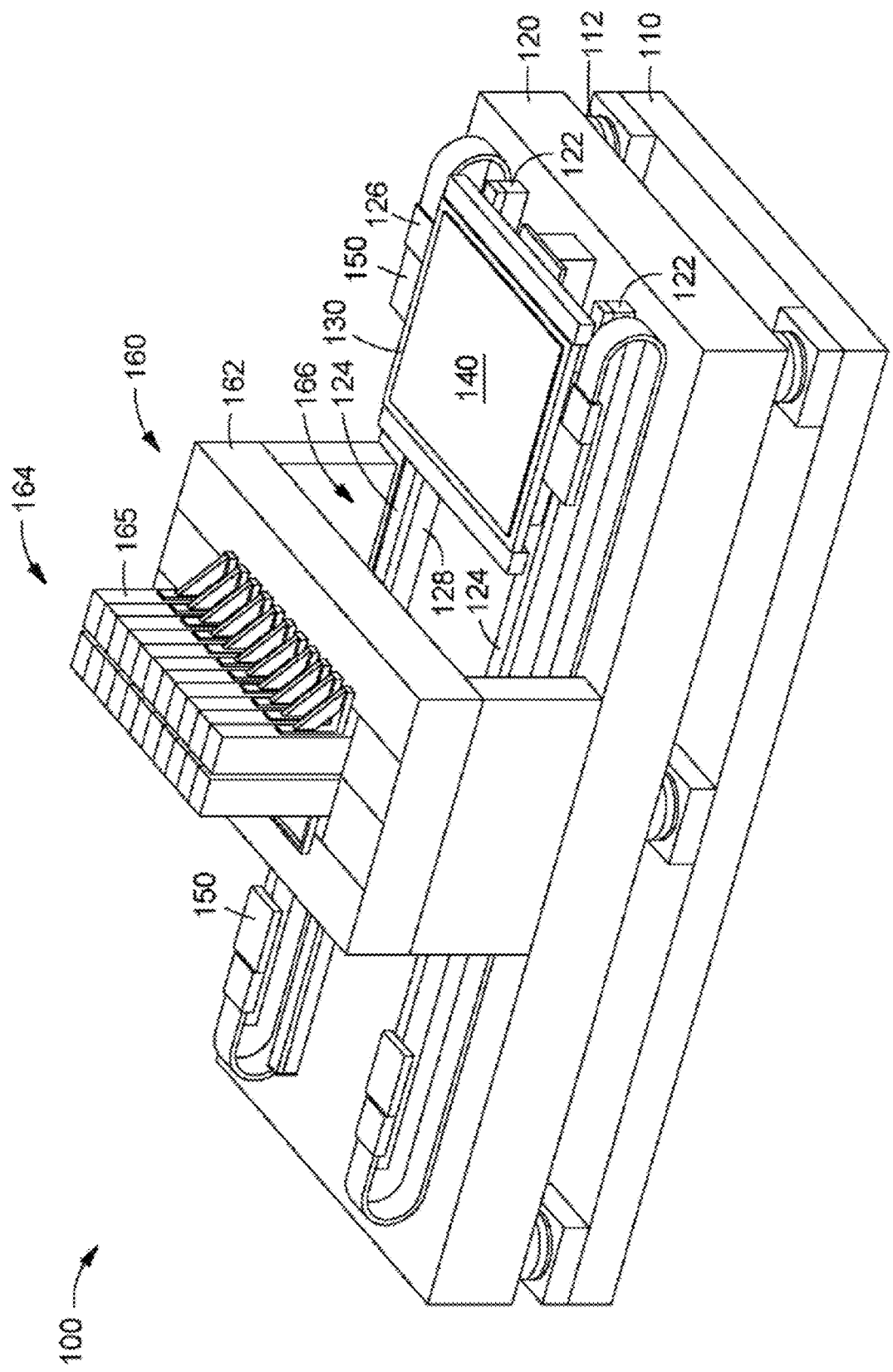
FIG. 1 is a perspective view of a lithography system, according to some embodiments.

FIG. 1 is a perspective view of a lithography system 100, according to some embodiments. The system 100 includes a base frame 110, a slab 120, a stage 130, and a processing apparatus 160. The base frame 110 rests on the floor of a fabrication facility and supports the slab 120. Passive air isolators 112 are positioned between the base frame 110 and the slab 120. In some embodiments, the slab 120 is a monolithic piece of granite, and the stage 130 is disposed on the slab 120. A substrate 140 is supported by the stage 130. A plurality of holes (not shown) are formed in the stage 130 for allowing a plurality of lift pins (not shown) to extend therethrough. In some embodiments, the lift pins rise to an extended position to receive the substrate 140, such as from one or more transfer robots (not shown). The one or more transfer robots are used to load and unload a substrate 140 from the stage 130.

The substrate 140 comprises any suitable material, for example, quartz used as part of a flat panel display. In other embodiments, the substrate 140 is made of other materials. In some embodiments, the substrate 140 has a photoresist layer formed thereon. A photoresist is sensitive to radiation. A positive photoresist includes portions of the photoresist, which when exposed to radiation, will be respectively soluble to photoresist developer applied to the photoresist after the pattern is written into the photoresist. A negative photoresist includes portions of the photoresist, which when exposed to radiation, will be respectively insoluble to photoresist developer applied to the photoresist after the pattern is written into the photoresist. The chemical composition of the photoresist determines whether the photoresist will be a positive photoresist or negative photoresist. Examples of photoresists include, but are not limited to, at least one of diazonaphthoquinone, a phenol formaldehyde resin, poly (methyl methacrylate), poly(methyl glutarimide), and SU-8. In this manner, the pattern is created on a surface of the substrate 140 to form the electronic circuitry.

The system 100 includes a pair of supports 122 and a pair of tracks 124. The pair of supports 122 are disposed on the slab 120, and the slab 120 and the pair of supports 122 are a single piece of material. The pair of tracks 124 is supported by the pair of the supports 122, and the stage 130 moves along the tracks 124 in the X-direction. In one embodiment, the pair of tracks 124 is a pair of parallel magnetic channels. As shown, each track 124 of the pair of tracks 124 is linear. In other embodiments, one or more track 124 is non-linear. An encoder 126 is coupled to the stage 130 in order to provide location information to a controller (not shown).

The processing apparatus 160 includes a support 162 and a processing unit 164. The support 162 is disposed on the slab 120 and includes an opening 166 for the stage 130 to pass under the processing unit 164. The processing unit 164 is supported by the support 162. In some embodiments, the processing unit 164 is a pattern generator configured to expose a photoresist in a lithography process. In some embodiments, the pattern generator is configured to perform a maskless lithography process. The processing unit 164 includes a plurality of image projection apparatus (shown in FIGS. 2A and 2B). In some embodiments, the processing unit 164 contains as many as 84 image projection apparatus. Each image projection apparatus is disposed in a case 165. The processing apparatus 160 is useful to perform maskless direct patterning.

During operation, the stage 130 moves in the X-direction from a loading position, as shown in FIG. 1, to a processing position. The processing position is one or more positions of the stage 130 as the stage 130 passes under the processing unit 164. During operation, the stage 130 is be lifted by a plurality of air bearings (not shown) and moves along the pair of tracks 124 from the loading position to the processing position. A plurality of vertical guide air bearings (not shown) are coupled to the stage 130 and positioned adjacent an inner wall 128 of each support 122 in order to stabilize the movement of the stage 130. The stage 130 also moves in the Y-direction by moving along a track 150 for processing and/or indexing the substrate 140. The stage 130 is capable of independent operation and can scan a substrate 140 in one direction and step in the other direction.

A metrology system measures the X and Y lateral position coordinates of each of the stage 130 in real time so that each of the plurality of image projection apparatus can accurately locate the patterns being written in a photoresist covered substrate. The metrology system also provides a real-time measurement of the angular position of each of the stage 130 about the vertical or Z-axis. The angular position measurement can be used to hold the angular position constant during scanning by means of a servo mechanism or it can be used to apply corrections to the positions of the patterns being written on the substrate 140 by an image projection apparatus.

Figure 2A:
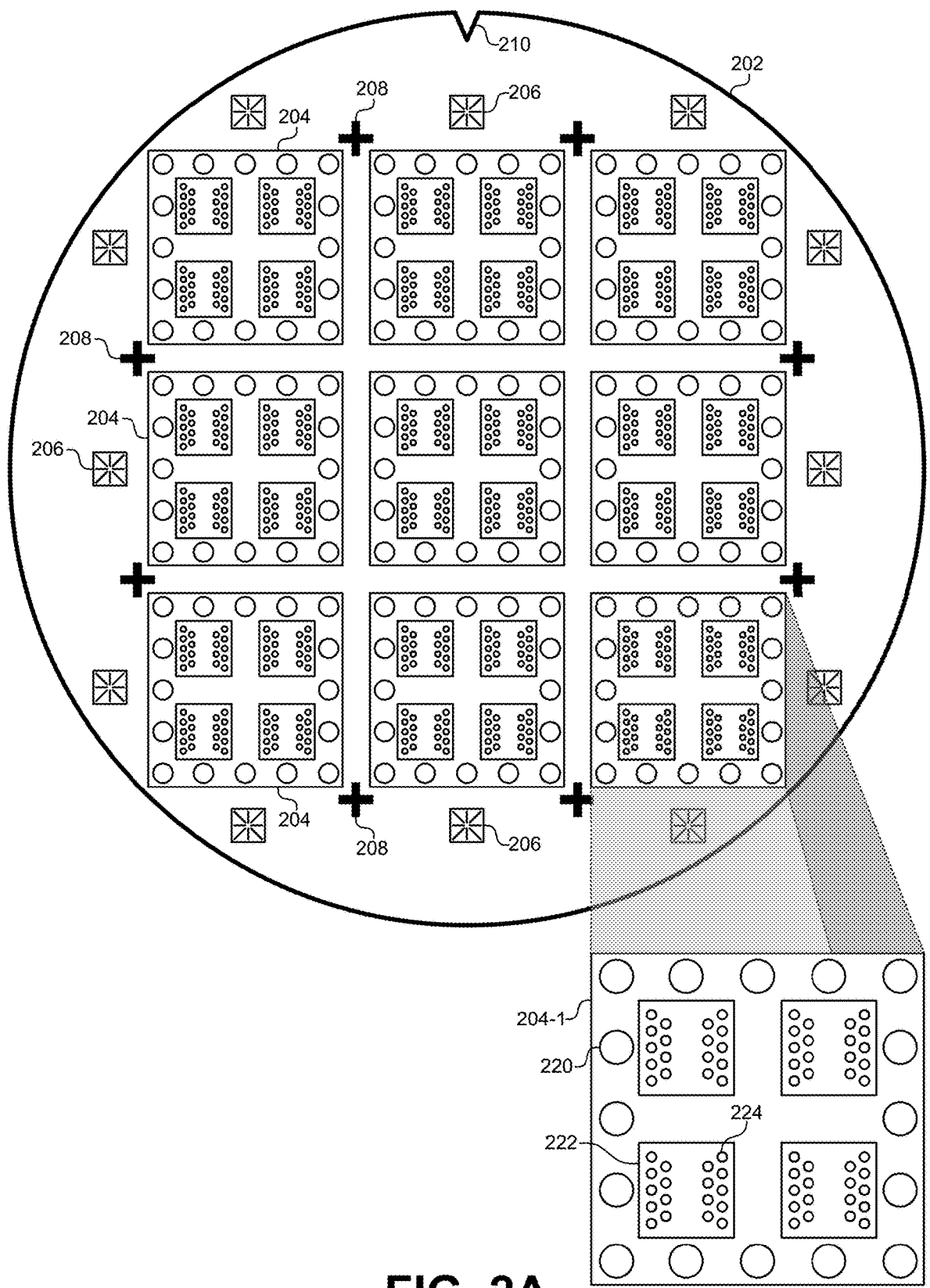
FIG. 2A illustrates a substrate, according to some embodiments.

FIG. 2A illustrates a substrate 202, according to some embodiments. The substrate 202 may comprise any type of material, including the materials described above for the substrate 140. This particular substrate 202 may include a number of different packages 204 that are formed on the surface of the substrate 202. Each of the packages 204 may include one or more individual dies 222 that have been fabricated from other semiconductor processes. For example, a single package 204-1 may include a plurality of dies 222 that represent individual integrated circuits and/or systems-on-a-chip, such as a processor, a memory, a digital signal processor (DSP), a memory controller, a cryptographic chip, and/or any other type of integrated circuit. Each of the packages may also include other features, such as metal pillars 220 that may be used to serve as mounting connections to later mount the packages 204 to printed circuit boards (PCBs). After the fabrication of the substrate 202 is complete, the substrate 202 may be cut apart and separated into the individual packages 204. This allows a large number of packages to be fabricated simultaneously on a substrate 202.

In addition to the dies 222, pillars 220, and other package or integrated circuit features, the substrate 202 may include alignment features that may be used by various semiconductor processing stations to orient the substrate 202 and identify specific locations on the substrate 202. For example, the substrate 202 itself may include global alignment features 206 that may be used to orient the substrate 202 as a whole. As used herein, an "alignment feature" may include any visual or physical feature on any portion of the substrate 202 that may be identified by a sensor, such as a camera. For example, global alignment features 206 may include markings that can be visual identified by a camera. These global alignment features may be used to orient or rotate the substrate 202 in semiconductor processing stations, such as a digital lithography system 100 as described above. By way of further example, the substrate 202 may also include global alignment features 208 that may be used to place or locate rows and columns of the packages 204. Additionally, an "alignment feature" may include a corner of a package, a corner of a die, and/or a bevel edge of a component or the substrate 202.

Each of the individual packages 204 and/or the individual dies 222 on the packages 204 may also include various alignment features. Although not shown explicitly, the packages 204 may include visual fiducials or markings similar to the global alignment features 206 that are specifically designed to be identified by a camera or other sensor. Additionally, the pillars 220 or other functional portions of the semiconductor circuits on the packages 204 may be used as alignment features. For example, the pillars 220 may be used to facilitate connections to a printed circuit board in another system, and the pillars 220 may also be used to identify a location or orientation of the packages 204. Similarly, each of the individual dies 222 on the packages 204 may also include alignment features 222. For example, exposed vias, pads, or other metal connections on the dies 222 may be used as alignment features 224 for the dies 222. Visual markings or symbols may also be specifically designed on the dies 222 to function as alignment features that may be visually identified by a camera or other sensor.

Figure 2B:
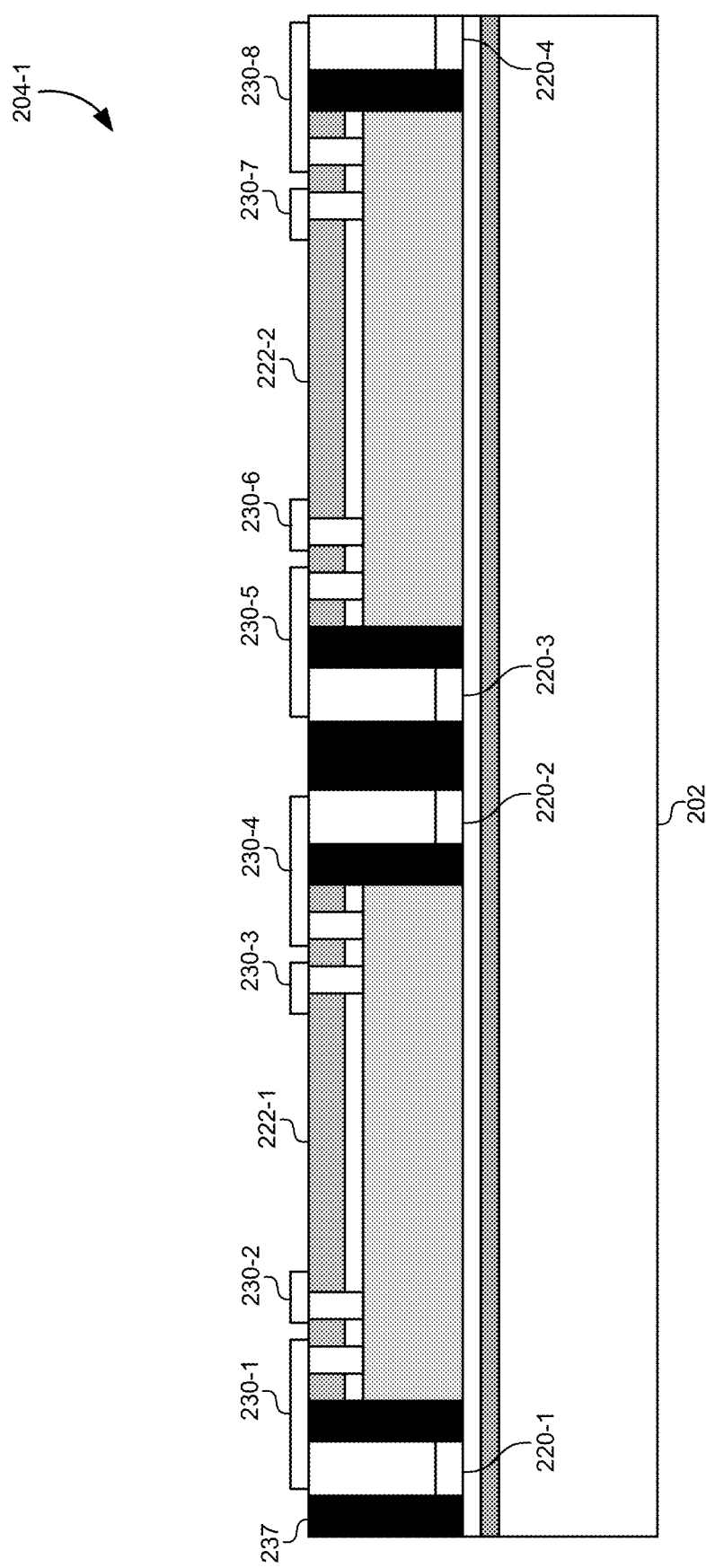
FIG. 2B illustrates a cross-sectional view of a package, according to some embodiments.

FIG. 2B illustrates a cross-sectional view of a package 204-1, according to some embodiments. The package may be formed on the substrate 202, which may alternatively be referred to as a carrier when the substrate 202 is separated into individual packages. The pillars 222 may be formed from standard semiconductor fabrication processes. For example, a mask layer may be formed with voids where the pillars 220 will be located, and a deposition process may then be used to deposit a metal layer into these voids to form the pillars 220. The mask layer may then be removed to leave the pillars 220 exposed. Because the fabrication process for the pillars 220 may use existing deposition and etch processes that are very accurate, the location of the pillars 220 may often be assumed to be correctly located. Therefore, as described above, the pillars 220 may be used as alignment features for the package 204-1 in some embodiments.

The dies 222 are typically not fabricated directly on the substrate 222 like the pillars 220. Instead, the dies 222 may be fabricated using other semiconductor processes and later adhered to the substrate 202. For example, some embodiments may first deposit a layer of epoxy or other adhesive above the substrate 202, and the dies 222 may be placed in the epoxy at a predetermined location based on the design of the package 204-1. In contrast to the very accurate placement of the pillars 220 using deposition and etch processes in semiconductor fabrication chambers, the physical placement of the dies 222 may be subject to larger variations in the final location after the epoxy has cured. For example, a pick-and-place machine may place the dies 222 at locations on the package 204-1. However, the physical tolerances of both the machinery and the substrate 202 may produce an error in the locations where the dies 222 are physically placed. Even if the dies 222 are placed in exactly the correct position on the package 204-1, the relatively high viscosity of the epoxy may allow the dies 222 to move after they are placed.

The difference between the expected locations of the dies 222 from the design and the actual physical locations of the dies 222 after physical placement during fabrication may negatively affect the accuracy with which the dies 222 may be interconnected on the package 204-1. For example, some embodiments may fill any voids on the package 204-1 with a conformal coating or epoxy to protect the individual components. This coating may be polished down to expose the surfaces of the pillars 220, the input/output (I/O) pads on the dies 222, and/or any other connection surfaces that are part of the package 204-1. In some embodiments, the substrate 202 may be placed in a digital lithography system 100 and the digital lithography techniques described above may be used to deposit traces 230 of metal and other features on the surface of the package 204-1 to form the interconnects of the package 204-1. If the dies 222 are not in the expected position, this very precise routing of the traces 230 formed by the digital lithography techniques may miss the intended I/O pads on the dies 222, which may render the package 204-1 inoperable and thereby lower the effective yield of the semiconductor process.

Figure 3A:
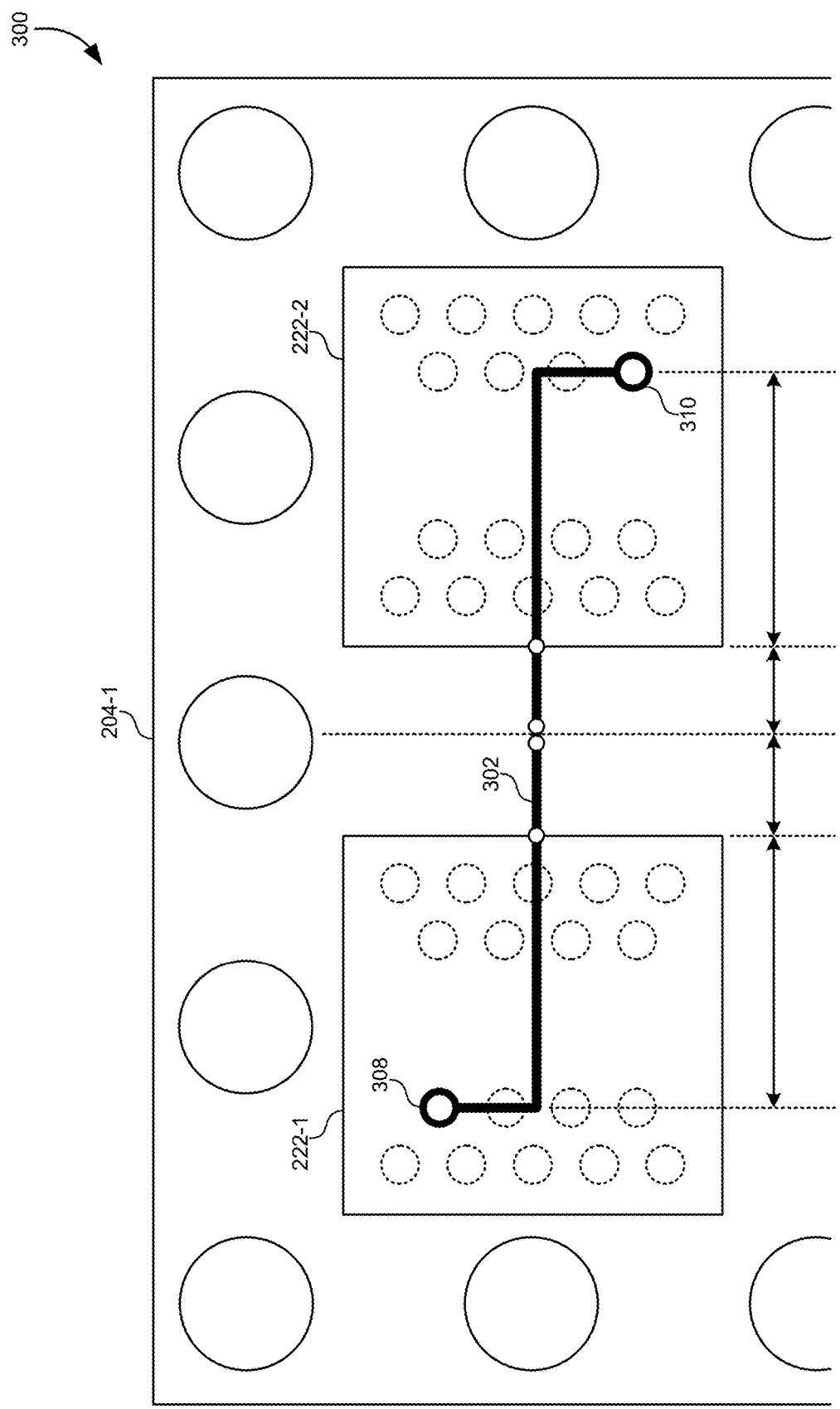
FIG. 3A illustrates a top view of a package with properly aligned dies, according to some embodiments.

FIG. 3A illustrates a top view 300 of a package 204-1 with properly aligned dies 222, according to some embodiments. In this example, a first die 222-1 and a second die 222-2 may be placed on the package 204-1. A design file for the package 204-1 may include a connection between an I/O pad 308 on the first die 222-1 and an I/O pad 310 on the second die 222-2. Traditionally, software would receive the design file (e.g., a .GDS file) for the substrate and translate the coordinates of the connections into a route for a trace 302 that would be represented in the program file for the digital lithography system. As described above, the digital lithography system may be configured to identify the alignment features on the substrate such that the substrate is properly aligned in the lithography station. It was then assumed that the actual locations of the packages 204 and dies 222 on the substrate could be located based on the relative coordinates from the global alignment features on the substrate. So long as the dies 222 were in the expected location, the trace 302 created between the I/O pad 308 and the I/O pad 310 would create a proper connection.

Note that the trace 302 may be routed such that the trace 302 did not intersect with other I/O pads on the dies 222. However, a straight route for the trace 302 is used in this example for the sake of simplicity. Additionally, many other dies may be present on the package 204-1 along with many additional traces that have also been omitted for clarity in illustrating the alignment of the trace 302.

Figure 3B:
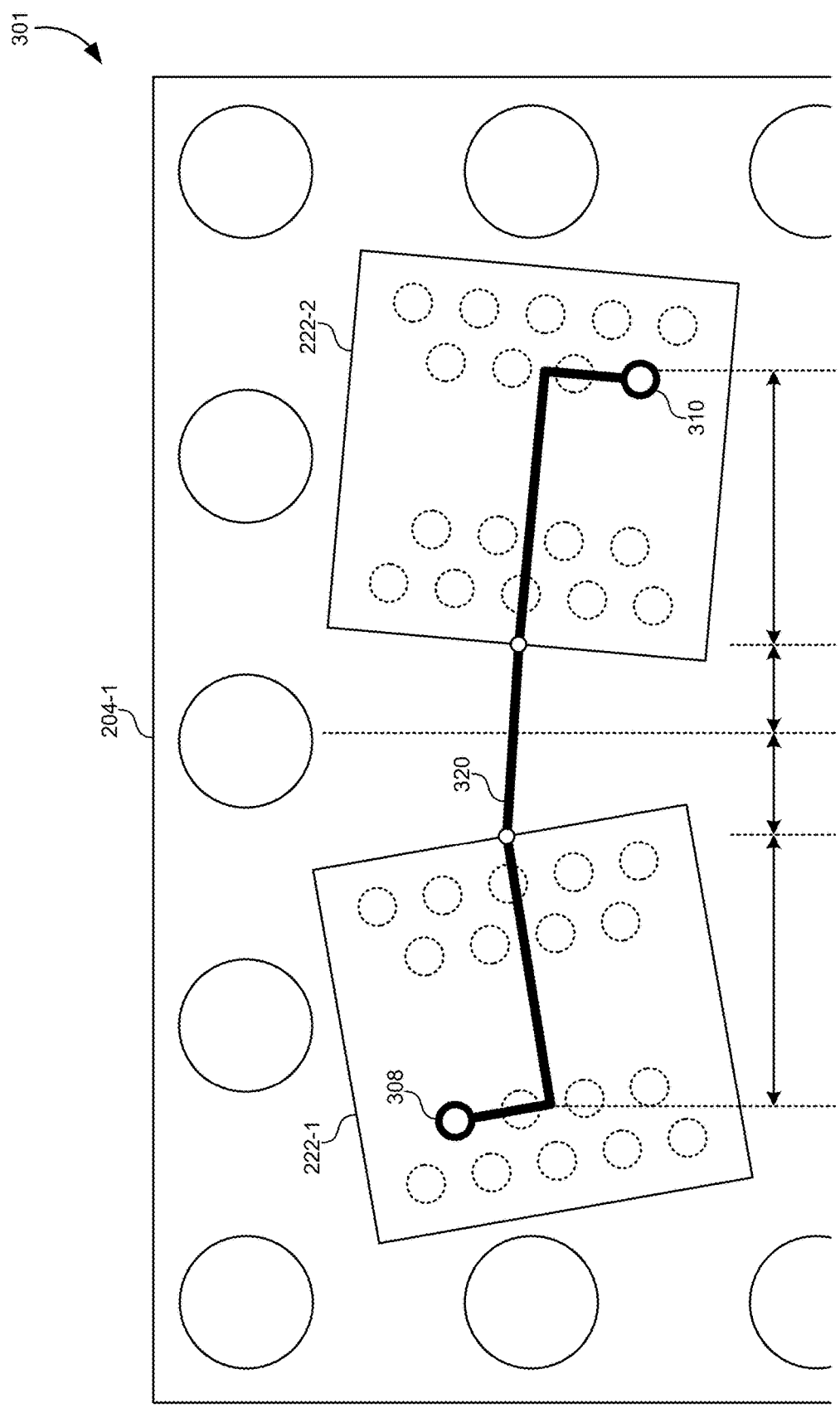
FIG. 3B illustrates a top view of a package with improperly aligned dies, according to some embodiments.

FIG. 3B illustrates a top view 301 of a package 204-1 with improperly aligned dies 222, according to some embodiments. As described above, the dies 222 may be misaligned, shifted, rotated, or otherwise placed such that they are not in the exact location as specified in the design file for the substrate or package 204-1. This may be due to movement in the epoxy, error tolerances in the physical placement process, and/or any other process variations. Regardless of how the misalignment is caused, this example shows how the routing between the I/O pad 308 and the I/O pad 310 may need to be adjusted in order to properly connect these I/O pads. For example, the trace 302 from FIG. 3A clearly would not properly connect these I/O pads when the dies 222 are out of place. To create a proper route for the trace 320, the misalignment of the dies 222 may be identified, a new location may be defined, and the trace 302 may be rerouted as trace 320 in order to properly make this connection.

The embodiments described herein provide an efficient method for identifying the actual physical locations of the dies 222 on the substrate without using a full metrology scan of the substrate. Instead, one or more cameras may be used to efficiently locate the approximate location of any of the alignment features based on their ideal positioning in the design file for the packages are substrate. The camera(s) may then be moved to locations where alignment features should be, and an image may be captured that may be analyzed to determine the actual physical location of the alignment feature. These actual physical locations of the alignment features may then be used to identify X/Y coordinates for the dies, as well as rotations and/or varying heights of the dies on the packages. A difference between the expected location from the design file and the actual physical location may be used to adjust the instructions for the digital lithography system to compensate for the misalignment of the dies.

Figure 4:
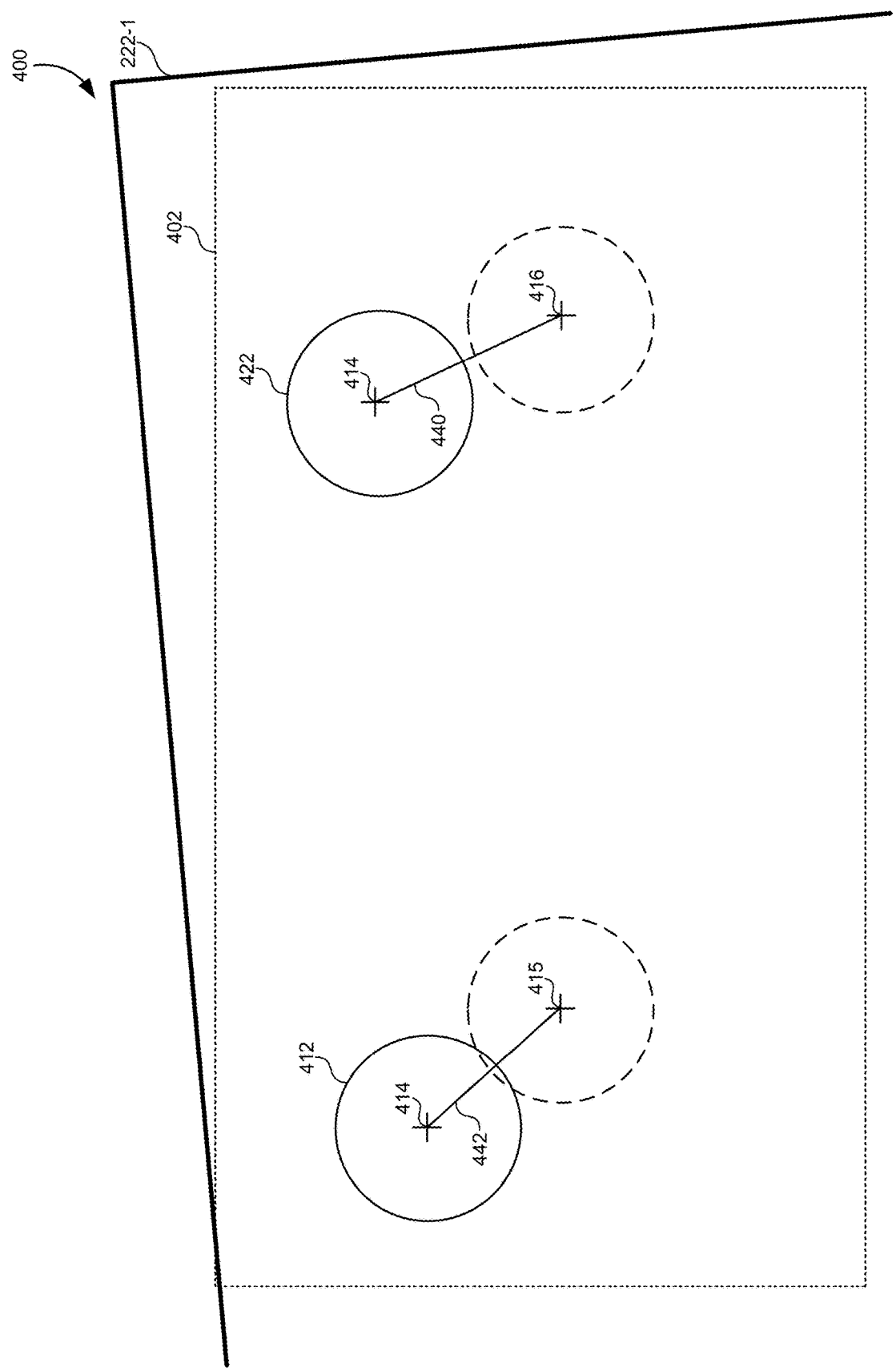
FIG. 4 illustrates how the actual locations of the dies may be located using the ideal locations from a design file, according to some embodiments.

FIG. 4 illustrates how the actual locations of the dies may be located using the ideal locations from a design file, according to some embodiments. This simplified example shows a zoomed-in view of alignment features on a die 222-1 that has been misaligned when placed on the corresponding package. The process may first determine a location for the camera based on the expected locations of the alignment features from the design. For example, the system may receive a design file for the package or substrate and parse the design file to extract a coordinate (e.g., an X/Y coordinate) for a center location of an alignment feature 422. The controller may then cause the camera to move its field of view 402 such that the camera captures a view of the expected location 416 where the alignment feature should be.

As described below, the system may include a semiconductor processing station with one or more cameras on movable mounts such that the cameras can be freely repositioned during this process of determining the actual physical locations of the alignment features. Note that this represents a significant technical improvement over existing methods. For example, a full metrology scan of the substrate can take as long as 20-30 minutes. Taking images of the entire substrate and using image processing algorithms to identify the locations of the alignment features also takes significant processing power and processing time. In contrast, by using the expected or ideal locations of the alignment features from the design file, the camera may be initially moved to a starting location that will be very close to the actual physical location of the alignment features. Instead of taking more than 20 minutes to identify the locations of the alignment features on the substrate, this process can be performed in under 60 seconds by optimizing the image capture locations for the cameras using the expected locations from the design.

As illustrated in FIG. 4, the field of view 402 for the camera may be positioned such that it would encompass the expected location 416 for the alignment feature 422, along with a sufficient amount of the surrounding area such that any movements of the die 222-1 when it is misaligned are likely to position the actual location 414 of the alignment feature 422 in the field of view 402. For example, the die 222-1 may have been shifted up in a Y direction and/or rotated slightly in a counterclockwise direction in FIG. 4 such that the actual location 414 of the alignment feature 422 is captured in the field of view 402. Instead of processing many images using computer vision techniques to identify a field of view that includes the alignment feature 422, this process may analyze a single image of the field of view 402 to identify the actual location 414 of the alignment feature 422.

In some cases, the camera may be positioned at a height and/or location such that the field of view 402 may encompass multiple alignment features. In this example, the field of view 402 may include another alignment feature 412. Instead of being centered around the expected location 416 of the alignment feature 422, the field of view 402 may be, for example, centered around a midpoint between the expected location 416 of the alignment feature 422 and the expected location 415 of the alignment feature 412. This further reduces the processing time for identifying the actual locations of alignment features, as a single image frame may be analyzed to identify the actual locations of multiple alignment features.

In some embodiments, the camera may be positioned to capture at least two alignment features for each die. For example, the camera may be positioned to capture a first alignment feature, then moved and positioned to capture a second alignment feature. Alternatively, the camera may be positioned to capture two alignment feature simultaneously. In other embodiments, the camera may be positioned to capture more than two alignment features (e.g., five alignment features). Using at the actual locations of at least two alignment features, the system may determine a new location for a die. The system may calculate differences between the actual locations of the alignment features and the expected locations of the alignment features. For example, a difference 442 may be calculated between the expected location 415 and the actual location 414 of the alignment feature 412. Similarly, a difference 440 may be calculated between the expected location 416 and the actual location 414 of the alignment feature 422. These differences may be calculated by first identifying centers of actual locations of the alignment features and calculating a distance between the actual center locations and the expected center locations as depicted in FIG. 4.

Alternatively, the difference may be determined and represented by a new location of the die 222-1. For example, the actual locations of at least two of the alignment features may be used to calculate a new location (e.g., position, rotation, and/or elevation) of the die 222-1. The actual location of the die 222-1 may then be compared to an expected location of the die 222-1 to adjust the instructions for the digital lithography system to ensure that any traces are correctly routed to I/O pads on the die 222-1. The new location of the die 222-1 may also update the locations of other alignment features on the die 222-1 that were not specifically identified in the images captured by the cameras.

Figure 5:
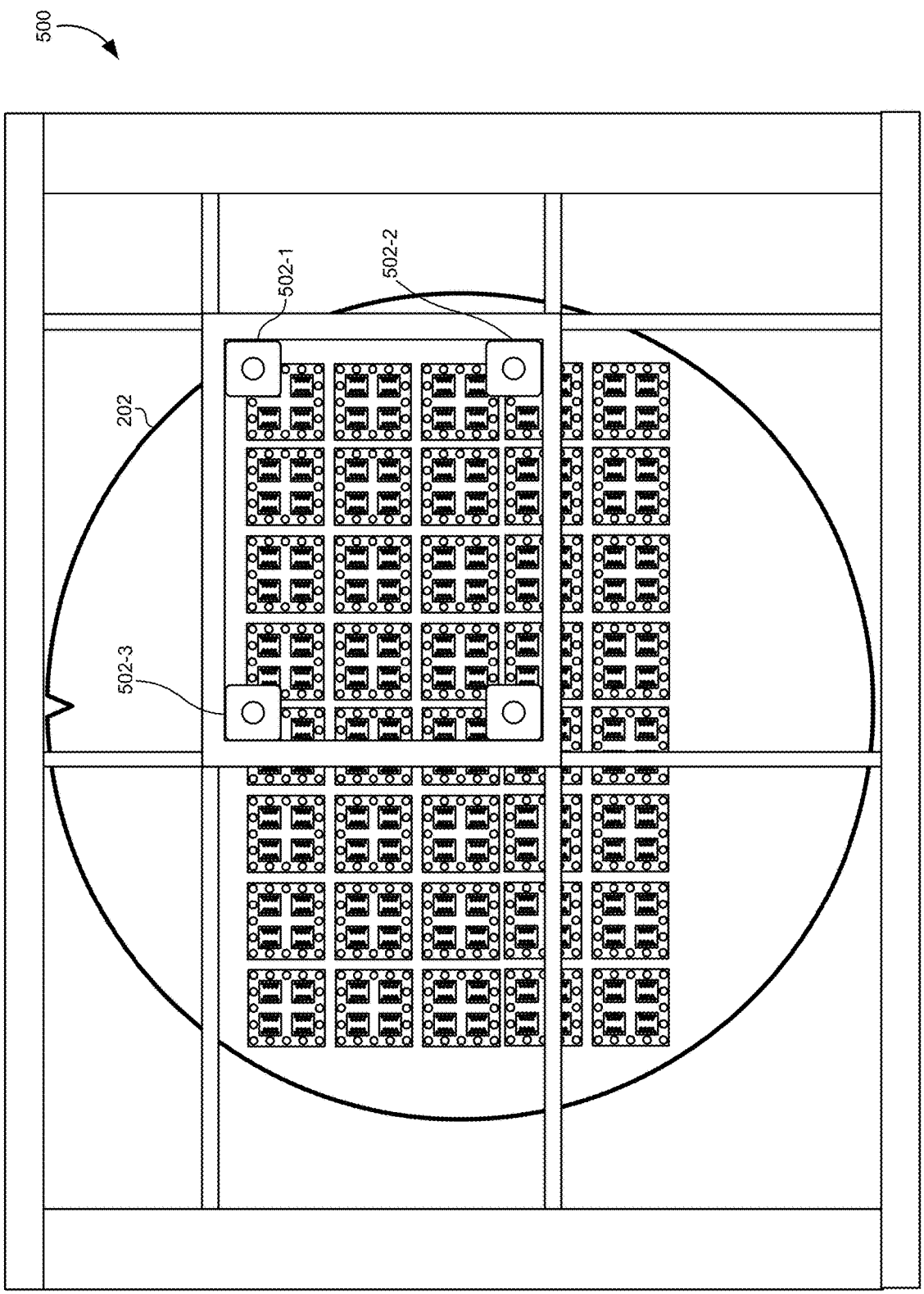
FIG. 5 illustrates a configuration for one or more cameras to capture images of expected locations for alignment features on the substrate, according to some embodiments.

FIG. 5 illustrates a configuration for one or more cameras to capture images of expected locations for alignment features on the substrate, according to some embodiments. In this example, a semiconductor processing station may include a plurality of cameras 502. The plurality of cameras 502 may be mounted on movable mounts, tracks, or other hardware that allows the cameras to move, rotate, pan, and/or tilt to capture the substrate 202 at different locations and/or angles. For example, cameras 502 may be mounted to fixtures with a guide bearing and/or motor that may move the cameras 502 precisely to be above different locations on the substrate 202.

In addition to improvements in throughput that may be achieved by positioning the cameras above the expected locations of the alignment features on the dies, some embodiments may further improve the performance of the system by optimally spacing or locating a plurality of cameras 502 based on the spacing of the expected locations of the individual dies. For example, it may be typical for the packages on the substrate 202 to be organized in a series of rows and/or columns on the substrate. The spacing and initial locations of the cameras 502 may be determined based on the number of cameras and the number of packages or dies in each row or column.

In FIG. 5, the semiconductor processing station may determine or receive a number of rows and/or columns of dies or packages on the substrate 202 from the design file for the package or substrate. The cameras 502 may then be spaced such that the cameras are also arranged in rows and/or columns and spaced based on the number of dies or packages in those rows and/or columns. For example, each row in FIG. 5 may include eight packages, and each column may include five packages. For a configuration having four cameras 502, the cameras 502 may be positioned in two rows and in two columns. The rows of cameras 502 may be evenly spaced along a corresponding row of packages. For example, the number of packages between the cameras in the row may be a multiple of the number of cameras in the row (e.g., eight packages in the row divided by two cameras in the row yields a spacing of four packages between the cameras in the row). Similarly, the columns of cameras 502 may be evenly spaced along a corresponding column of packages. For example, the number of packages between cameras in the column may be a multiple of the number of cameras in the column (e.g., five packages in the column divided by two cameras in the column yields a spacing of two or three packages between the cameras, depending on how each embodiment rounds the result).

Note that although this example uses package spacing, other embodiments may use spacing between the dies rather than the packages. The methodology described above may work with the spacing between any type of component on the substrate, including packages, dies, and other components with alignment features without limitation.

By spacing the cameras 502 in this manner, the number of camera movements and images captured may be minimized. Some embodiments may mount the cameras 502 together on a rack as shown in FIG. 5 such that all of the cameras 502 can be moved together, as well as individually on the rack. Thus, between each image capture, all of the cameras 502 may be moved together to the next package in the row/column to capture a subsequent image. For example, by moving the rack with the cameras 502 together in FIG. 5, and assuming that each image capture may cover an entire package in the field of view of the camera, all of the dies on the entire substrate 202 may be captured in nine movements (e.g., three for each column, and three for each row). This number may be increased or decreased based on how many packages may be captured with sufficient precision in the field of view of the camera 502. This number may also be increased with smaller fields of view that capture alignment features on individual dies rather than packages.

Instead of spacing the cameras equally between the dies, some embodiments may space the cameras based on their effective field of view. The field of view of each camera may be adjusted based on the precision required to accurately detect the alignment features such that the field of view is maximized. For example, the distance between the camera and the substrate and/or the focus settings of each camera may be adjusted to increase the field of view so long as the alignment features can still be accurately detected when analyzing the resulting images. Thus, the cameras 502 may be spaced vertically and/or horizontally such that their fields of view are adjacent or overlapping, and the fields of view may be increased to capture images of multiple alignment features simultaneously in each image. The camera rack may continue to move all the cameras together horizontally or vertically in increments that are the size of the combined field of view of the cameras.

In some embodiments, the cameras 502 may be implemented using line scan cameras rather than field of view cameras. The operation using line scan cameras may be similar, except the initial positions of the cameras may be determined such that they will scan each row over the expected locations of the alignment features. Instead of scanning every increment or set of pixels in each row, the movement of the cameras may be optimized such that they skip down to lines where alignment features are expected to be located.

Although FIG. 5 illustrates a plurality of cameras 502, some embodiments may be implemented using only a single camera. In these embodiments, the single camera may scan or move across each row of packages or dies to capture images of each of the alignment features.

Figure 6A:
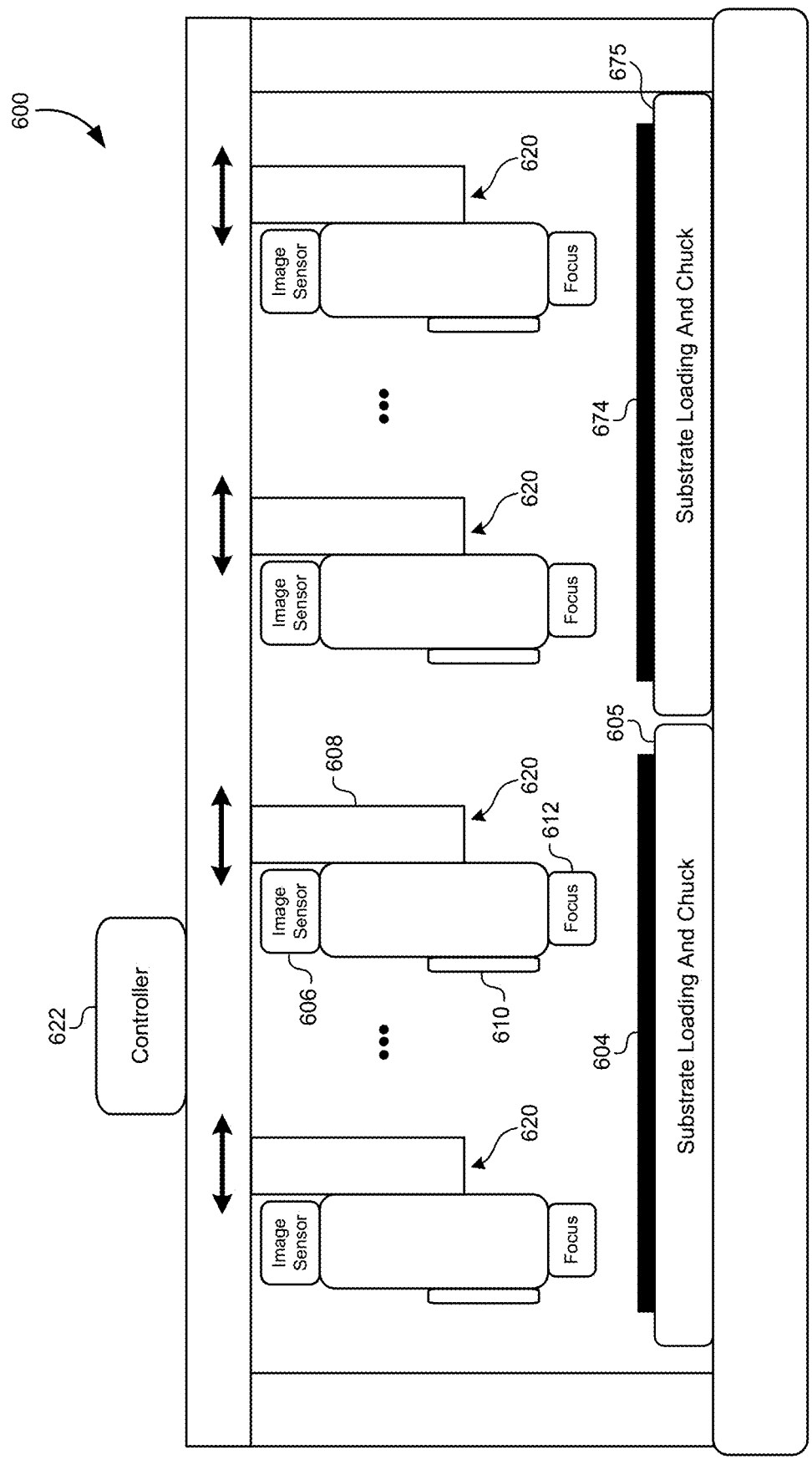
FIG. 6A illustrates a semiconductor processing station with cameras for efficiently capturing actual locations of alignment features, according to some embodiments.

FIG. 6A illustrates a semiconductor processing station 600 with cameras for efficiently capturing actual locations of alignment features, according to some embodiments. The processing station may include one or more chucks 605, 675 that are configured to load and secure one or more substrates 604, 674 in the semiconductor processing station 600. A semiconductor processing station 600 having two chucks 605, 675 for holding to corresponding substrates 604, 674 is illustrated only by way of example and is not meant to be limiting. Other embodiments may include only a single chuck/substrate, while some embodiments may include more than two chucks/substrates.

As described above, the semiconductor processing station 600 may include multiple cameras 620 that are optimally positioned above the substrates 604, 674 based on the expected locations of the dies or alignment features. The cameras 620 may include an image sensor 606 and a mount 608 that may allow the cameras 620 to move, pan, and/or tilt as described above. Additionally, some embodiments may include a displacement sensor 610 on the cameras 620. The displacement sensor 610 may also be referred to as a distance sensor or a height sensor in practice. The displacement sensor 610 may be configured to measure a distance between the camera and the surface of the corresponding substrate. For example, the displacement sensor 610 may be implemented using an optical sensor that projects a spot onto the surface of the substrate that is reflected back into the optical sensor to determine a corresponding displacement distance. The displacement sensor 610 may improve the measurement process by identifying locations on the substrate 604 that are warped, bowed, or otherwise distorted.

When a camera is moved to a new location to capture an image or scan a line along the substrate 604, a new displacement measurement may be captured by the displacement sensor 610. The displacement may then be used to adjust a focus element 612 for the camera. This allows each image to be focused appropriately to compensate for any irregularities in the height of the substrate 604. By capturing a displacement measurement at each location where an image is captured, a displacement map may also be generated for the substrate 604. The displacement map may be used to adjust the way in which the substrate 604 is later secured to the chuck in the digital lithography station. For example, a portion of the substrate 604 that bows upward may be mounted more securely or held tighter to the chuck in order to flatten the substrate 604 during the lithography process so that the bow does not affect the focus and precision of the lithography.

The semiconductor processing station 600 may include a controller 622. The controller 622 may be programmed using stored instructions (e.g., stored on one or more non-transitory computer-readable media), and the instructions may cause one or more processors of the controller 602 to perform various operations. For example, these operations may include retrieving or receiving a design file for the package or substrate, and parsing the design file to identify expected locations of the alignment features or the dies on the substrate. The controller 622 may also be programmed to control the movement of the cameras 620. For example, based on the expected locations of certain alignment features, the controller 622 may cause the cameras to move such that the cameras 620 are arranged in rows/columns as described above, and may cause the cameras to progress through scan lines or rows/columns to capture images of the expected locations of the alignment features as described above. In some embodiments, the controller 622 may also determine the differences between the expected locations and the actual locations for the alignment features and/or the dies in the packages. The controller 622 may also adjust or generate instructions for the digital lithography station to compensate for the differences between the expected and actual locations of the alignment features or dies in the packages.

Figure 6B:
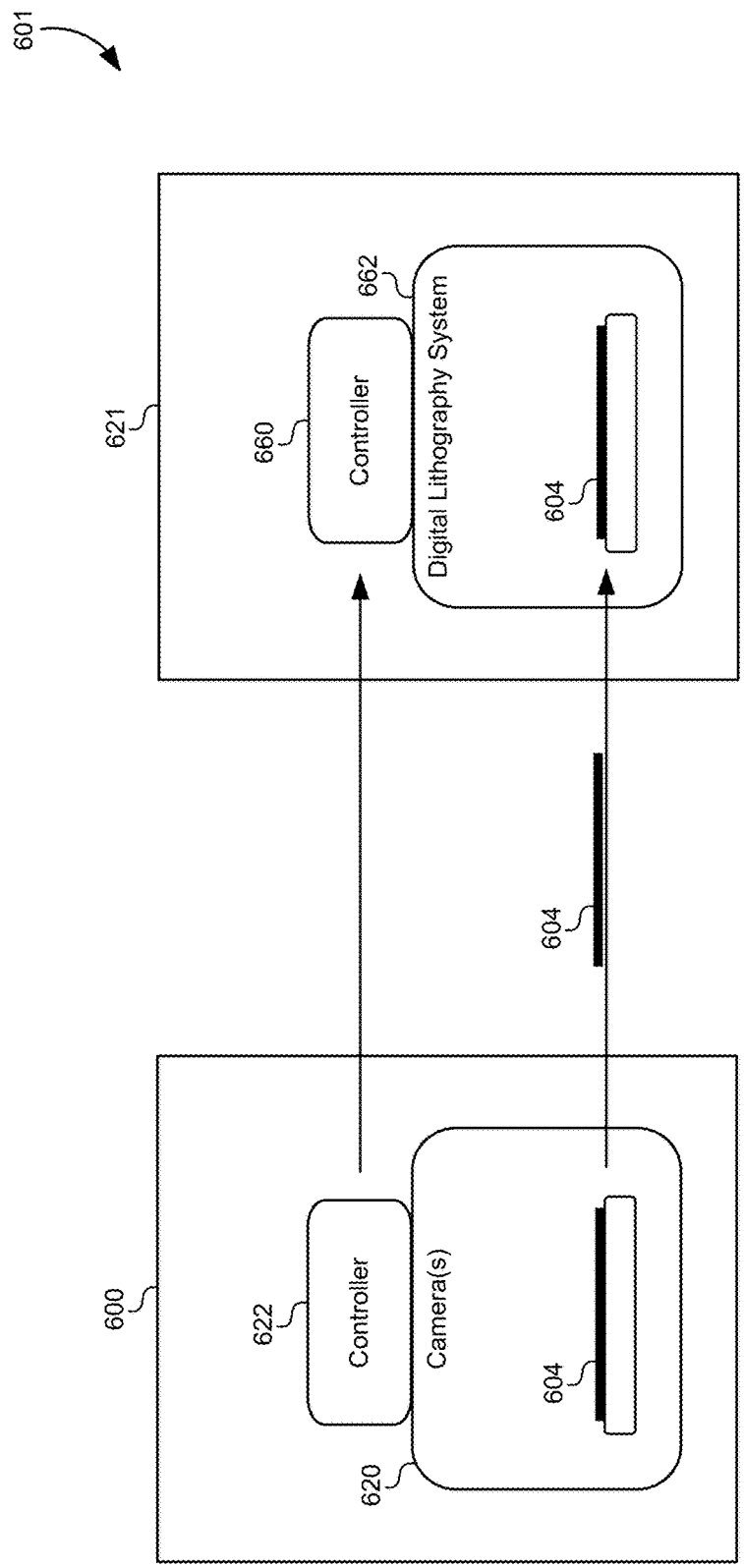
FIG. 6B illustrates a system that includes a plurality of semiconductor processing stations, according to some embodiments.

FIG. 6B illustrates a system 601 that includes a plurality of semiconductor processing stations, according to some embodiments. The system may include a first semiconductor processing station 600 that includes one or more cameras 620 and the controller 622 as described above. The first semiconductor processing station 600 may be configured to load a substrate 604 and efficiently capture images of the expected locations of the alignment features or dies as described above.

The system 601 may also include a second semiconductor processing system 621 that is configured to receive the substrate 604 after the images are captured by the first semiconductor processing station 600. For example, the second semiconductor processing system 621 may include a digital lithography system 662, such as the digital lithography system 100 described above. The second semiconductor processing system 621 may also include a controller 660, which may include similar components (e.g., memory devices, instructions, processors, etc.) as the controller 622 described above. Exemplary hardware that may be used to implement the controllers 622, 660 is described below in relation to FIG. 10. The controller 660 may be configured to receive differences between the expected locations of the actual locations of the components on the substrate 604, such as a modified file that includes the new locations of dies with their position, rotation, and height displacements as described above. This information may be received from the controller 622 of the first semiconductor processing station 600, and may be used to adjust or generate the instructions for the digital lithography system to compensate for the differences between the expected and actual locations of the dies. The controller 660 may then cause the digital lithography system 662 to execute a digital lithography process using the adjusted or generated instructions.

As illustrated in FIG. 6B, two separate and distinct semiconductor processing stations 600, 621 may be used. The first semiconductor processing station 600 may be specifically designed to efficiently capture the images of the expected locations of the alignment features using the camera configurations described above. The camera process executed by the first semiconductor processing station 600 may thereby be distinguished from any scan or metrology proves that takes place on the second semiconductor processing station 621 with the digital lithography system 662. Next, the substrate 604 may be removed from the first semiconductor processing station 600 and transported to the second semiconductor processing station 621. For example, the substrate 604 to be removed using a robotic arm or other automated technology that does not require human intervention. The semiconductor processing stations 600, 621 may be part of a multi-station machine that sequentially performs semiconductor processes, such as deposition, etch, polishing, cleaning, metrology, lithography, and so forth, on the substrate 604.

Figure 7:
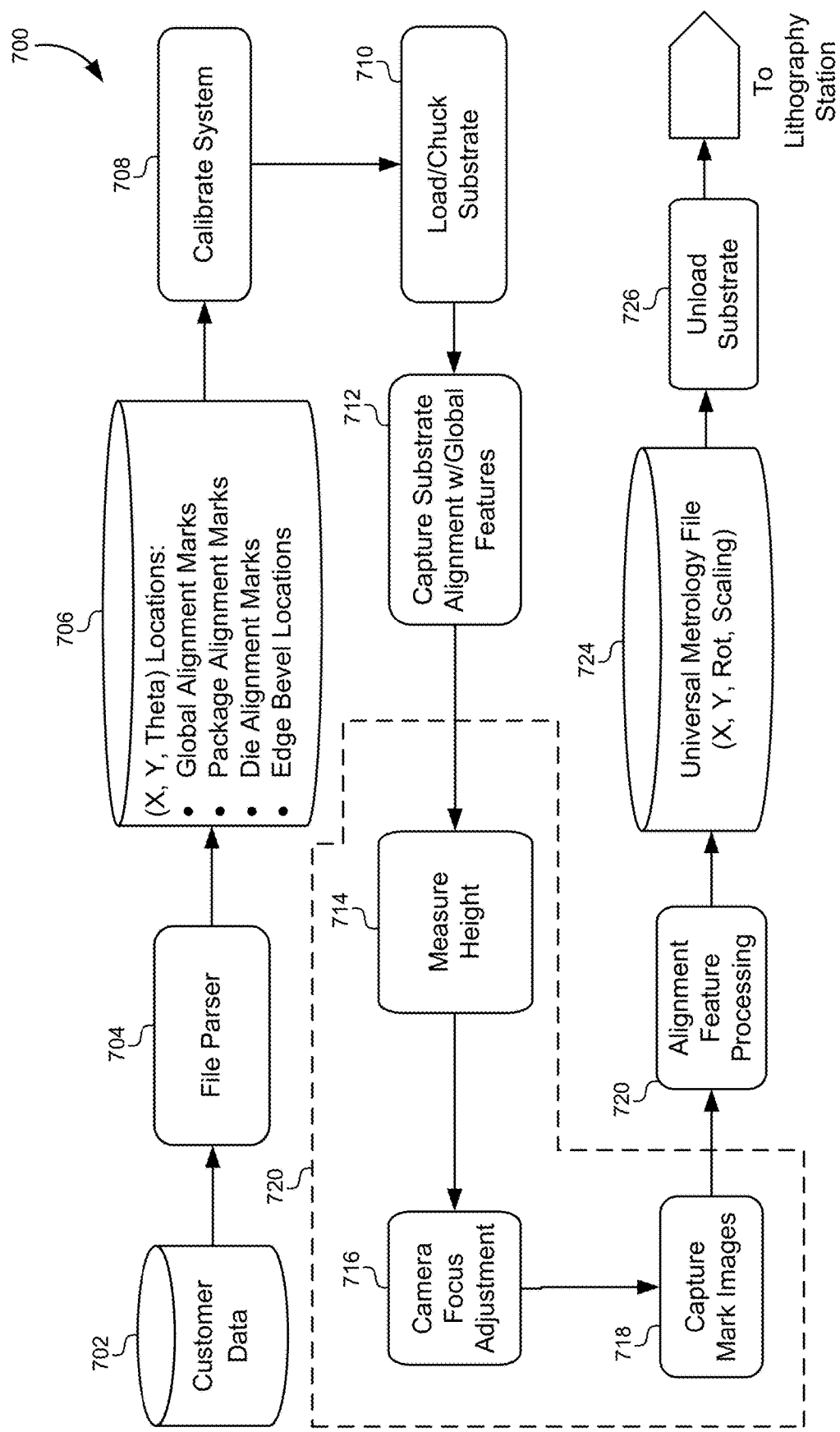
FIG. 7 illustrates a flowchart of a method for determining differences between expected and actual locations of dies, according to some embodiments.

FIG. 7 illustrates a flowchart 700 of a method for determining differences between expected and actual locations of dies, according to some embodiments. The method may be carried out by the first semiconductor processing station 600 described above in FIG. 6B. The method may include retrieving a design file from a database (702) that may store design files or other customer data. A file parser (704) may be executed to identify and extract location information for various components and/or alignment features in the design. This information may be stored in a database (706), and may include expected locations for global alignment marks on the substrate, die alignment marks, package alignment marks, and other features, such as edge bevel locations, package corners, die corners, and so forth.

Some embodiments may also calibrate the system using a calibration substrate (708). For example, a substrate with the alignment features in correct locations may be used to calibrate the camera locations, camera focus settings, and so forth. This calibration process may be executed initially when processing a new substrate design, and periodically between batches of substrates being processed. After removing the calibration substrate, a substrate may be loaded onto a chuck or other substrate-holding device (710) and placed into the first semiconductor processing station.

The substrate may be properly aligned in the first semiconductor processing station by capturing the global substrate alignment features (712). As described above, these global alignment features on the substrate may be used to properly align or calibrate the cameras in relation to the substrate. Since the global alignment features are not physically placed onto the substrate, but are instead formed on the substrate, it may be assumed by some embodiments that they are in the expected location from the design file for the substrate. As described above, the expected locations from the design file may then be used to set initial positions and spacings for a plurality of cameras when more than one camera is used in the first semiconductor processing station.

To capture images of the expected locations, an image capture process (720) may be executed at each camera location. For example, at each location, the displacement sensor on the camera may measure a height or displacement between the camera and the corresponding service of the substrate (714). This displacement measurement may then be used to adjust the focus settings for the camera (716), and an image may be acquired using the camera that captures at least one of the alignment features in the field of view (718). As described above, some embodiments may capture multiple alignment features in the field of view of each camera.

The image capture process (720) may be used for embodiments that include field of view cameras. However, this process is also compatible with scan line cameras. These embodiments may replace the image capture process (720) illustrated in FIG. 7 with a step that performs an on-the-fly displacement measurement between the camera and the substrate by scanning a line across a row of the substrate rather than stepping over columns as a function of the width of the field of view of the camera.

When images of the expected locations of the alignment features have been acquired, each of the images may be processed to identify center locations for each of the alignment features (720). For example, a center location may be identified for each of the alignment features, and the center locations may be considered the actual locations of the alignment features in comparison to the expected locations from the design files. In some embodiments, the alignment feature processing (720) may use the actual locations to determine a difference between the actual locations in the expected locations. This difference may be represented as a new location for the dies on which the alignment features are located. The location (e.g., the X/Y coordinates, rotation, scaling, displacement, etc.) for the actual location of the die may be determined and stored (724), for example, in a Universal Metrology File (UMF) with a corresponding identifier for the substrate. The substrate may then be unloaded from the first semiconductor processing station (726) and transported to the second semiconductor processing station for digital lithography.

Figure 8:
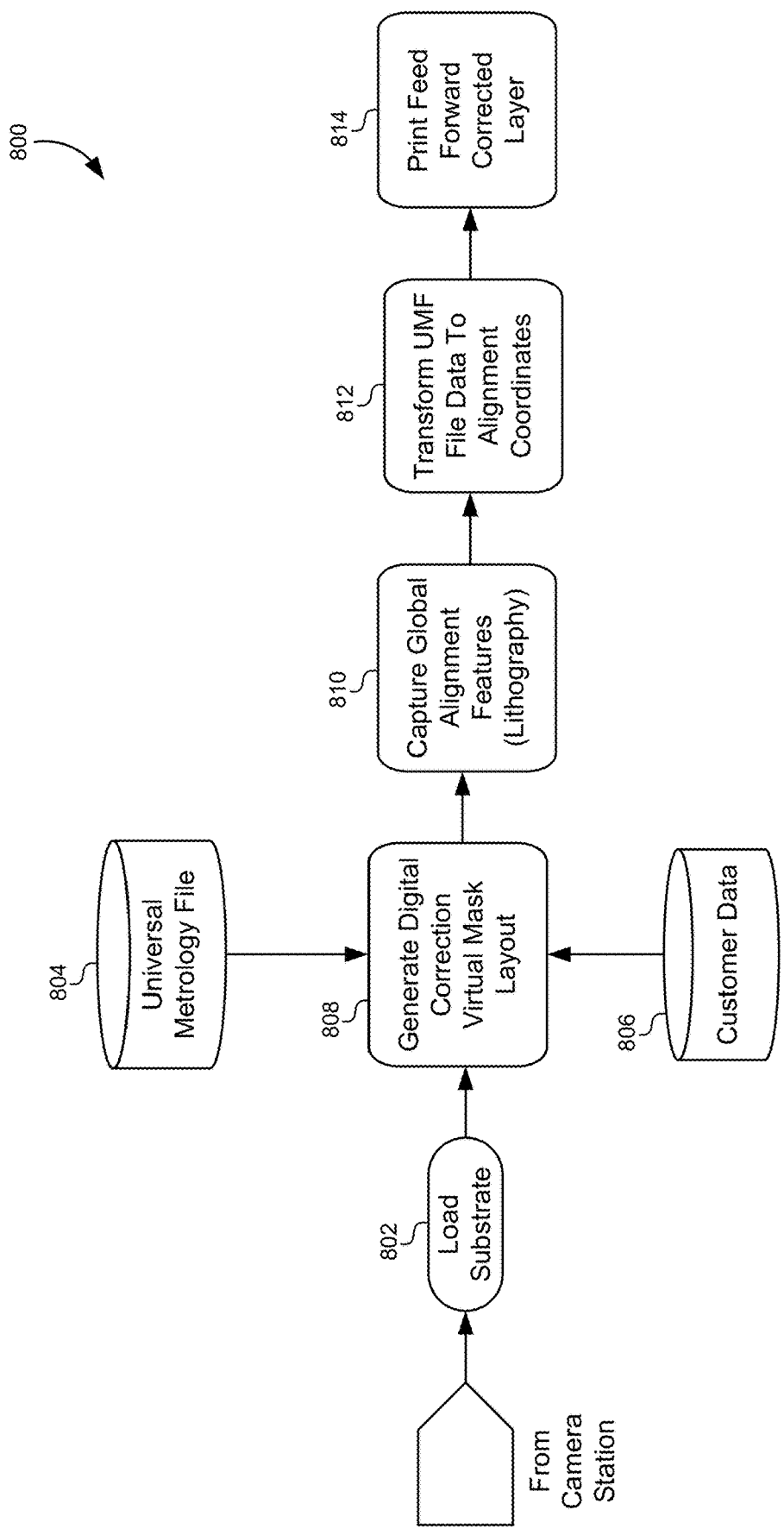
FIG. 8 illustrates a flowchart of a method for adjusting a digital lithography process to compensate for differences between expected and actual locations of dies on a substrate, according to some embodiments.

FIG. 8 illustrates a flowchart 800 of a method for adjusting a digital lithography process to compensate for differences between expected and actual locations of dies on a substrate, according to some embodiments. This method may be carried out by the controller of the second semiconductor processing station described above in FIG. 6B. The substrate may be received from the first semiconductor processing station and placed into the second semiconductor processing station (802). The controller may receive the actual locations of the dies on the substrate (804) from, for example, the UMF file described above. The controller may also receive the original design data for the substrate or packages (806). The controller may then determine differences between the actual locations of the dies and the expected locations of the dies and generate a digital correction or adjustment to the virtual mask layout (808). For example, the controller may adjust or generate instructions for the lithography process that compensate for the difference between the actual and expected locations of the dies. The traces that are routed by the lithography process may adjust the corresponding start and end locations to be consistent with the actual locations on the dies. The controller may then generate a new route between the endpoints using existing routing techniques.

To execute the digital lithography process, the second semiconductor processing station may capture positions of the global alignment features on the substrate (810) to properly align or identify the location of the substrate within the station. The metrology file may then be translated into alignment coordinates used by the lithography process (812), and the lithography process may then print the corrected or adjusted layer (e.g., routed traces) onto the substrate as described above in relation to FIG. 1.

Figure 9:
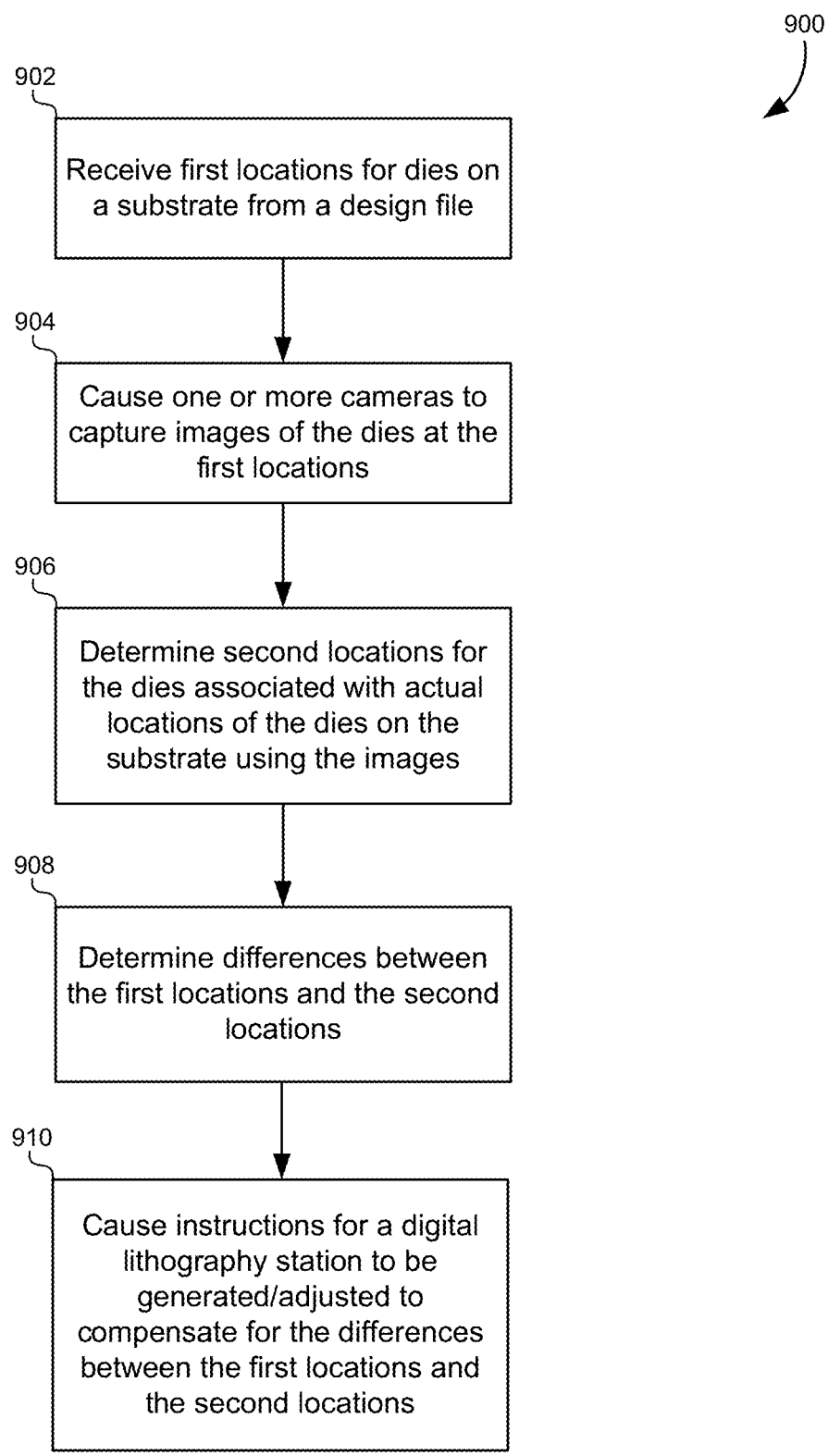
FIG. 9 illustrates a flowchart of a method for adjusting digital lithography to compensate for die placement errors, according some embodiments.

FIG. 9 illustrates a flowchart 900 of a method for adjusting digital lithography to compensate for die placement errors, according some embodiments. This method may be executed by one or more controllers. For example, these operations may be divided between controllers for multiple semiconductor processing stations as described above in FIG. 6B. Alternatively, a central server or central controller may execute each of these operations and cause the semiconductor processing chambers to operate accordingly.

The method may include receiving first locations for a plurality of dies on a substrate from a design file of the substrate (902). The first locations for the dies may include expected locations for the dies from the design file. The first locations may also include alignment features positioned on the dies, such as visual fiducials, die corners, I/O pads, or other features that may be visually identified and distinguished in a camera image. The first locations may include image coordinates (X, Y, Theta) from a GDS file for expected center locations of the alignment features or the dies themselves.

The method may further include causing one or more cameras to capture images of the plurality of dies at the first locations (904). A controller may cause a single camera or multiple cameras to move to initial positions based on the first locations. For example, a camera may move to an expected location of an alignment feature on a die such that a field of view of the camera captures the expected location of the alignment feature. As described above in FIGS. 4-5 this step may also include causing cameras to move into rows and/or columns that are based on a number of dies or packages in each row and/or column on the substrate.

The method may additionally include determining second locations for the plurality of dies associated with actual locations of the plurality of dies on the substrate (906). For example, the second locations may be the actual locations of alignment features on the dies. The captured images may have a field of view that encompasses a view of these actual locations such that the second locations may be identified by processing these images.

The method may also include determining differences between the first locations and the second locations (908). The differences may be determined by identifying an actual location of the dies in terms of X/Y coordinates, rotation, scale, and so forth, in comparison to the original locations. These differences may be determined by virtue of storing a new location for the die in a UMF file, or these differences may be stored as displacements from the expected locations.

The method may further include causing instructions for a digital lithography station to be generated or adjusted to compensate for the differences between the first locations and the second locations (910). For example, a first semiconductor processing station configured with cameras may cause these instructions to be generated or adjusted by sending the UMF file or other indication of the actual locations of the dies or alignment features to a controller for the lithography station for the instructions to be generated or adjusted. The adjusted or generated instructions may perform a new routing between the actual locations of the endpoints of a trace or other lithography feature.

It should be appreciated that the specific steps illustrated in FIG. 9 provide particular methods of adjusting digital of fog if you compensate for die placement errors according to various embodiments. Other sequences of steps may also be performed according to alternative embodiments. For example, alternative embodiments may perform the steps outlined above in a different order. Moreover, the individual steps illustrated in FIG. 9 may include multiple sub-steps that may be performed in various sequences as appropriate to the individual step. Furthermore, additional steps may be added or removed depending on the particular applications. Many variations, modifications, and alternatives also fall within the scope of this disclosure.

Each of the methods described herein may be implemented by a computer system. Each step of these methods may be executed automatically by the computer system, and/or may be provided with inputs/outputs involving a user. For example, a user may provide inputs for each step in a method, and each of these inputs may be in response to a specific output requesting such an input, wherein the output is generated by the computer system. Each input may be received in response to a corresponding requesting output. Furthermore, inputs may be received from a user, from another computer system as a data stream, retrieved from a memory location, retrieved over a network, requested from a web service, and/or the like. Likewise, outputs may be provided to a user, to another computer system as a data stream, saved in a memory location, sent over a network, provided to a web service, and/or the like. In short, each step of the methods described herein may be performed by a computer system, and may involve any number of inputs, outputs, and/or requests to and from the computer system which may or may not involve a user. Those steps not involving a user may be said to be performed automatically by the computer system without human intervention. Therefore, it will be understood in light of this disclosure, that each step of each method described herein may be altered to include an input and output to and from a user, or may be done automatically by a computer system without human intervention where any determinations are made by a processor. Furthermore, some embodiments of each of the methods described herein may be implemented as a set of instructions stored on a tangible, non-transitory storage medium to form a tangible software product.

Figure 10:
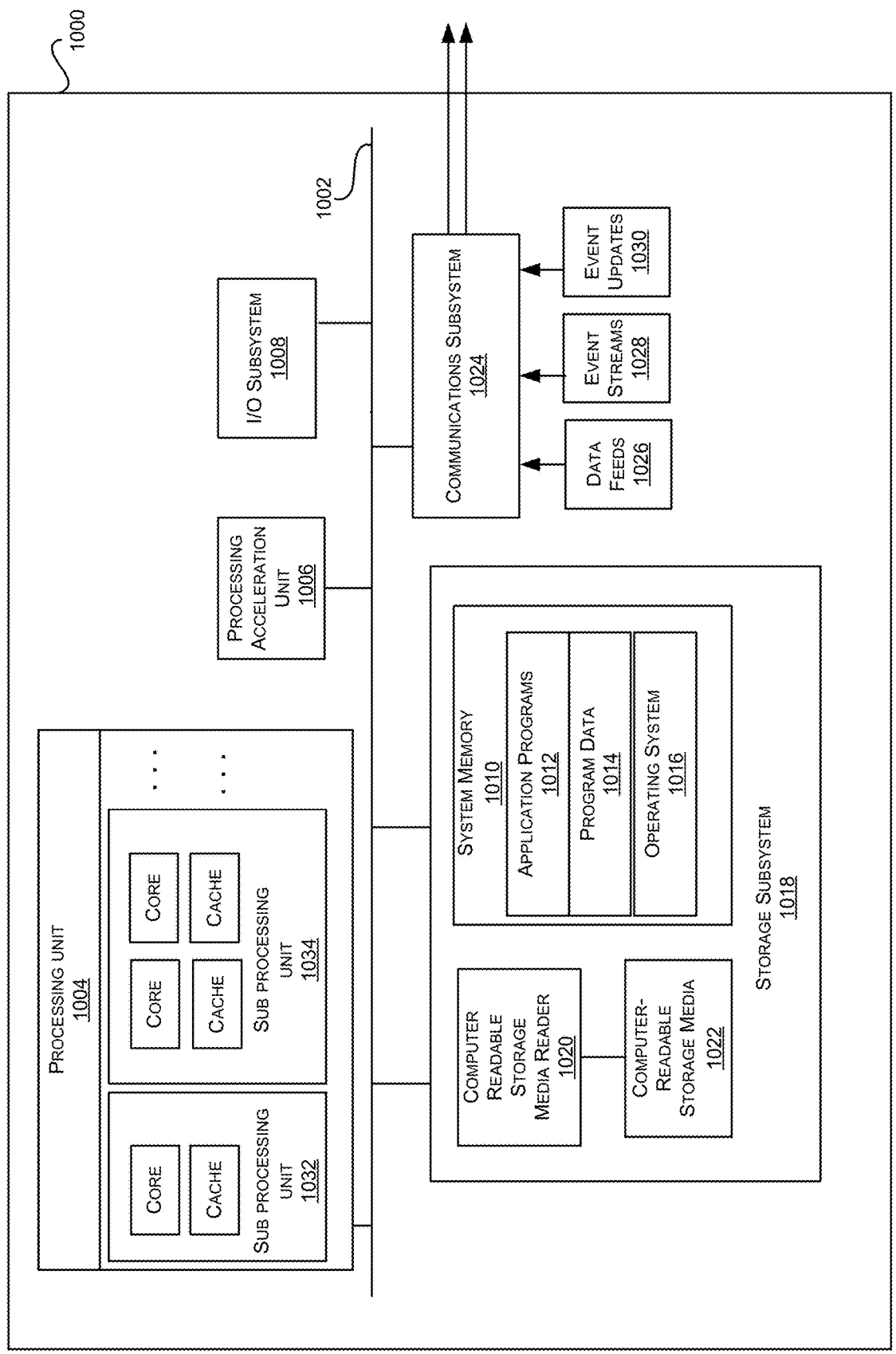
FIG. 10 illustrates an exemplary computer system, in which various embodiments may be implemented.

FIG. 10 illustrates an exemplary computer system 1000, in which various embodiments may be implemented. The system 1000 may be used to implement any of the computer systems described above. As shown in the figure, computer system 1000 includes a processing unit 1004 that communicates with a number of peripheral subsystems via a bus subsystem 1002. These peripheral subsystems may include a processing acceleration unit 1006, an I/O subsystem 1008, a storage subsystem 1018 and a communications subsystem 1024. Storage subsystem 1018 includes tangible computer-readable storage media 1022 and a system memory 1010.

Bus subsystem 1002 provides a mechanism for letting the various components and subsystems of computer system 1000 communicate with each other as intended. Although bus subsystem 1002 is shown schematically as a single bus, alternative embodiments of the bus subsystem may utilize multiple buses. Bus subsystem 1002 may be any of several types of bus structures including a memory bus or memory controller, a peripheral bus, and a local bus using any of a variety of bus architectures. For example, such architectures may include an Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus, which can be implemented as a Mezzanine bus manufactured to the IEEE P1386.1 standard.

Processing unit 1004, which can be implemented as one or more integrated circuits (e.g., a conventional microprocessor or microcontroller), controls the operation of computer system 1000. One or more processors may be included in processing unit 1004. These processors may include single core or multicore processors. In certain embodiments, processing unit 1004 may be implemented as one or more independent processing units 1032 and/or 1034 with single or multicore processors included in each processing unit. In other embodiments, processing unit 1004 may also be implemented as a quad-core processing unit formed by integrating two dual-core processors into a single chip.

In various embodiments, processing unit 1004 can execute a variety of programs in response to program code and can maintain multiple concurrently executing programs or processes. At any given time, some or all of the program code to be executed can be resident in processor(s) 1004 and/or in storage subsystem 1018. Through suitable programming, processor(s) 1004 can provide various functionalities described above. Computer system 1000 may additionally include a processing acceleration unit 1006, which can include a digital signal processor (DSP), a special-purpose processor, and/or the like.

I/O subsystem 1008 may include user interface input devices and user interface output devices. User interface input devices may include a keyboard, pointing devices such as a mouse or trackball, a touchpad or touch screen incorporated into a display, a scroll wheel, a click wheel, a dial, a button, a switch, a keypad, audio input devices with voice command recognition systems, microphones, and other types of input devices. User interface input devices may include, for example, motion sensing and/or gesture recognition devices such as the Microsoft Kinect® motion sensor that enables users to control and interact with an input device, such as the Microsoft Xbox® 360 game controller, through a natural user interface using gestures and spoken commands. User interface input devices may also include eye gesture recognition devices such as the Google Glass® blink detector that detects eye activity (e.g., 'blinking' while taking pictures and/or making a menu selection) from users and transforms the eye gestures as input into an input device (e.g., Google Glass®). Additionally, user interface input devices may include voice recognition sensing devices that enable users to interact with voice recognition systems (e.g., Siri® navigator), through voice commands.

User interface input devices may also include, without limitation, three dimensional (3D) mice, joysticks or pointing sticks, gamepads and graphic tablets, and audio/visual devices such as speakers, digital cameras, digital camcorders, portable media players, webcams, image scanners, fingerprint scanners, barcode reader 3D scanners, 3D printers, laser rangefinders, and eye gaze tracking devices. Additionally, user interface input devices may include, for example, medical imaging input devices such as computed tomography, magnetic resonance imaging, position emission tomography, medical ultrasonography devices. User interface input devices may also include, for example, audio input devices such as MIDI keyboards, digital musical instruments and the like.

User interface output devices may include a display subsystem, indicator lights, or non-visual displays such as audio output devices, etc. The display subsystem may be a cathode ray tube (CRT), a flat-panel device, such as that using a liquid crystal display (LCD) or plasma display, a projection device, a touch screen, and the like. In general, use of the term "output device" is intended to include all possible types of devices and mechanisms for outputting information from computer system 1000 to a user or other computer. For example, user interface output devices may include, without limitation, a variety of display devices that visually convey text, graphics and audio/video information such as monitors, printers, speakers, headphones, automotive navigation systems, plotters, voice output devices, and modems.

Computer system 1000 may comprise a storage subsystem 1018 that comprises software elements, shown as being currently located within a system memory 1010. System memory 1010 may store program instructions that are loadable and executable on processing unit 1004, as well as data generated during the execution of these programs.

Depending on the configuration and type of computer system 1000, system memory 1010 may be volatile (such as random access memory (RAM)) and/or non-volatile (such as read-only memory (ROM), flash memory, etc.) The RAM typically contains data and/or program modules that are immediately accessible to and/or presently being operated and executed by processing unit 1004. In some implementations, system memory 1010 may include multiple different types of memory, such as static random access memory (SRAM) or dynamic random access memory (DRAM). In some implementations, a basic input/output system (BIOS), containing the basic routines that help to transfer information between elements within computer system 1000, such as during start-up, may typically be stored in the ROM. By way of example, and not limitation, system memory 1010 also illustrates application programs 1012, which may include client applications, Web browsers, mid-tier applications, relational database management systems (RDBMS), etc., program data 1014, and an operating system 1016. By way of example, operating system 1016 may include various versions of Microsoft Windows®, Apple Macintosh®, and/or Linux operating systems, a variety of commercially-available UNIX® or UNIX-like operating systems (including without limitation the variety of GNU/Linux operating systems, the Google Chrome® OS, and the like) and/or mobile operating systems such as iOS, Windows® Phone, Android® OS, BlackBerry® 10 OS, and Palm® OS operating systems.

Storage subsystem 1018 may also provide a tangible computer-readable storage medium for storing the basic programming and data constructs that provide the functionality of some embodiments. Software (programs, code modules, instructions) that when executed by a processor provide the functionality described above may be stored in storage subsystem 1018. These software modules or instructions may be executed by processing unit 1004. Storage subsystem 1018 may also provide a repository for storing data used in accordance with some embodiments.

Storage subsystem 1000 may also include a computer-readable storage media reader 1020 that can further be connected to computer-readable storage media 1022. Together and, optionally, in combination with system memory 1010, computer-readable storage media 1022 may comprehensively represent remote, local, fixed, and/or removable storage devices plus storage media for temporarily and/or more permanently containing, storing, transmitting, and retrieving computer-readable information.

Computer-readable storage media 1022 containing code, or portions of code, can also include any appropriate media, including storage media and communication media, such as but not limited to, volatile and non-volatile, removable and non-removable media implemented in any method or technology for storage and/or transmission of information. This can include tangible computer-readable storage media such as RAM, ROM, electronically erasable programmable ROM (EEPROM), flash memory or other memory technology, CD-ROM, digital versatile disk (DVD), or other optical storage, magnetic cassettes, magnetic tape, magnetic disk storage or other magnetic storage devices, or other tangible computer readable media. This can also include nontangible computer-readable media, such as data signals, data transmissions, or any other medium which can be used to transmit the desired information and which can be accessed by computing system 1000.

By way of example, computer-readable storage media 1022 may include a hard disk drive that reads from or writes to non-removable, nonvolatile magnetic media, a magnetic disk drive that reads from or writes to a removable, non-volatile magnetic disk, and an optical disk drive that reads from or writes to a removable, nonvolatile optical disk such as a CD ROM, DVD, and Blu-Ray® disk, or other optical media. Computer-readable storage media 1022 may include, but is not limited to, Zip® drives, flash memory cards, universal serial bus (USB) flash drives, secure digital (SD) cards, DVD disks, digital video tape, and the like. Computer-readable storage media 1022 may also include, solid-state drives (SSD) based on non-volatile memory such as flash-memory based SSDs, enterprise flash drives, solid state ROM, and the like, SSDs based on volatile memory such as solid state RAM, dynamic RAM, static RAM, DRAM-based SSDs, magnetoresistive RAM (MRAM) SSDs, and hybrid SSDs that use a combination of DRAM and flash memory based SSDs. The disk drives and their associated computer-readable media may provide non-volatile storage of computer-readable instructions, data structures, program modules, and other data for computer system 1000.

Communications subsystem 1024 provides an interface to other computer systems and networks. Communications subsystem 1024 serves as an interface for receiving data from and transmitting data to other systems from computer system 1000. For example, communications subsystem 1024 may enable computer system 1000 to connect to one or more devices via the Internet. In some embodiments communications subsystem 1024 can include radio frequency (RF) transceiver components for accessing wireless voice and/or data networks (e.g., using cellular telephone technology, advanced data network technology, such as 3G, 4G or EDGE (enhanced data rates for global evolution), WiFi (IEEE 802.11 family standards, or other mobile communication technologies, or any combination thereof), global positioning system (GPS) receiver components, and/or other components. In some embodiments communications subsystem 1024 can provide wired network connectivity (e.g., Ethernet) in addition to or instead of a wireless interface.

In some embodiments, communications subsystem 1024 may also receive input communication in the form of structured and/or unstructured data feeds 1026, event streams 1028, event updates 1030, and the like on behalf of one or more users who may use computer system 1000.

By way of example, communications subsystem 1024 may be configured to receive data feeds 1026 in real-time from users of social networks and/or other communication services such as Twitter® feeds, Facebook® updates, web feeds such as Rich Site Summary (RSS) feeds, and/or real-time updates from one or more third party information sources.

Additionally, communications subsystem 1024 may also be configured to receive data in the form of continuous data streams, which may include event streams 1028 of real-time events and/or event updates 1030, that may be continuous or unbounded in nature with no explicit end. Examples of applications that generate continuous data may include, for example, sensor data applications, financial tickers, network performance measuring tools (e.g. network monitoring and traffic management applications), clickstream analysis tools, automobile traffic monitoring, and the like.

Communications subsystem 1024 may also be configured to output the structured and/or unstructured data feeds 1026, event streams 1028, event updates 1030, and the like to one or more databases that may be in communication with one or more streaming data source computers coupled to computer system 1000.

Computer system 1000 can be one of various types, including a handheld portable device (e.g., an iPhone® cellular phone, an iPad® computing tablet, a PDA), a wearable device (e.g., a Google Glass® head mounted display), a PC, a workstation, a mainframe, a kiosk, a server rack, or any other data processing system.

Due to the ever-changing nature of computers and networks, the description of computer system 1000 depicted in the figure is intended only as a specific example. Many other configurations having more or fewer components than the system depicted in the figure are possible. For example, customized hardware might also be used and/or particular elements might be implemented in hardware, firmware, software (including applets), or a combination. Further, connection to other computing devices, such as network input/output devices, may be employed. Based on the disclosure and teachings provided herein, other ways and/or methods to implement the various embodiments should be apparent.

In the foregoing description, for the purposes of explanation, numerous specific details were set forth in order to provide a thorough understanding of various embodiments. It will be apparent, however, that some embodiments may be practiced without some of these specific details. In other instances, well-known structures and devices are shown in block diagram form.

The foregoing description provides exemplary embodiments only, and is not intended to limit the scope, applicability, or configuration of the disclosure. Rather, the foregoing description of various embodiments will provide an enabling disclosure for implementing at least one embodiment. It should be understood that various changes may be made in the function and arrangement of elements without departing from the spirit and scope of some embodiments as set forth in the appended claims.

Specific details are given in the foregoing description to provide a thorough understanding of the embodiments. However, it will be understood that the embodiments may be practiced without these specific details. For example, circuits, systems, networks, processes, and other components may have been shown as components in block diagram form in order not to obscure the embodiments in unnecessary detail. In other instances, well-known circuits, processes, algorithms, structures, and techniques may have been shown without unnecessary detail in order to avoid obscuring the embodiments.

Also, it is noted that individual embodiments may have been described as a process which is depicted as a flowchart, a flow diagram, a data flow diagram, a structure diagram, or a block diagram. Although a flowchart may have described the operations as a sequential process, many of the operations can be performed in parallel or concurrently. In addition, the order of the operations may be re-arranged. A process is terminated when its operations are completed, but could have additional steps not included in a figure. A process may correspond to a method, a function, a procedure, a subroutine, a subprogram, etc. When a process corresponds to a function, its termination can correspond to a return of the function to the calling function or the main function.

The term "computer-readable medium" includes, but is not limited to, portable or fixed storage devices, optical storage devices, wireless channels and various other mediums capable of storing, containing, or carrying instruction(s) and/or data. A code segment or machine-executable instructions may represent a procedure, a function, a subprogram, a program, a routine, a subroutine, a module, a software package, a class, or any combination of instructions, data structures, or program statements. A code segment may be coupled to another code segment or a hardware circuit by passing and/or receiving information, data, arguments, parameters, or memory contents. Information, arguments, parameters, data, etc., may be passed, forwarded, or transmitted via any suitable means including memory sharing, message passing, token passing, network transmission, etc.

Furthermore, embodiments may be implemented by hardware, software, firmware, middleware, microcode, hardware description languages, or any combination thereof. When implemented in software, firmware, middleware or microcode, the program code or code segments to perform the necessary tasks may be stored in a machine readable medium. A processor(s) may perform the necessary tasks.

In the foregoing specification, features are described with reference to specific embodiments thereof, but it should be recognized that not all embodiments are limited thereto. Various features and aspects of some embodiments may be used individually or jointly. Further, embodiments can be utilized in any number of environments and applications beyond those described herein without departing from the broader spirit and scope of the specification. The specification and drawings are, accordingly, to be regarded as illustrative rather than restrictive.

Additionally, for the purposes of illustration, methods were described in a particular order. It should be appreciated that in alternate embodiments, the methods may be performed in a different order than that described. It should also be appreciated that the methods described above may be performed by hardware components or may be embodied in sequences of machine-executable instructions, which may be used to cause a machine, such as a general-purpose or special-purpose processor or logic circuits programmed with the instructions to perform the methods. These machine-executable instructions may be stored on one or more machine readable mediums, such as CD-ROMs or other type of optical disks, floppy diskettes, ROMs, RAMs, EPROMs, EEPROMs, magnetic or optical cards, flash memory, or other types of machine-readable mediums suitable for storing electronic instructions. Alternatively, the methods may be performed by a combination of hardware and software.

What is claimed is:

1. A system comprising:
a first semiconductor processing station comprising:
one or more cameras; and
a first controller configured to perform first operations comprising:
receiving first locations for a plurality of dies on a substrate from a design file of the substrate;
causing the one or more cameras to capture images of the plurality of dies at the first locations;
determining, based on the images of the dies at the first locations, second locations for the plurality of dies associated with actual locations of the plurality of dies on the substrate; and
determining differences between the first locations and the second locations; and
a second semiconductor processing station that is separate and distinct from the first semiconductor processing station and configured to receive the substrate after images are captured by the first semiconductor processing station, the second semiconductor processing station comprising:
a digital lithography system; and
a second controller configured to perform second operations comprising:
generating or adjusting instructions for the digital lithography system to change trace routes between the plurality of dies to compensate for the differences between the first locations and the second locations; and
causing the digital lithography system to execute a digital lithography process on the substrate using the instructions to form the trace routes between connections on first sides of the plurality of dies, wherein the first sides are opposite second sides of the plurality of dies that are mounted to the substrate.

2. The system of claim 1, wherein the one or more cameras comprises a plurality of cameras.

3. The system of claim 2, wherein the first operations further comprise:
receiving a number of dies in rows on the substrate; and
causing the plurality of cameras to be spaced such that the plurality of cameras are arranged in rows and spaced based on the number of dies in the rows on the substrate.

4. The system of claim 3, wherein the first operations further comprise:
receiving a number of dies in columns on the substrate; and
causing the plurality of cameras to be spaced such that the plurality of cameras are also arranged in columns and spaced based on the number of dies in the columns on the substrate.

5. The system of claim 1, further comprising a robotic arm that moves the substrate between the first semiconductor processing station and the second semiconductor processing station.

6. The system of claim 1, further comprising one or more displacement sensors located with the one or more cameras that are configured to measure a distance between the one or more cameras and the substrate at the locations where the one or more cameras capture the images of the plurality of dies at the first locations.

7. The system of claim 6, wherein the first operations further comprise:
determining the distance between the one or more cameras and the substrate; and
adjusting a focus of the one or more cameras based on the distance.

8. The system of claim 1, wherein the differences between the first locations and the second locations of the plurality of dies result from a misalignment when the plurality of dies are adhered to the substrate.

9. One or more non-transitory computer-readable media comprising instructions that, when executed by one or more processors, cause the one or more processors to perform operations comprising:
receiving first locations for a plurality of dies on a substrate from a design file of the substrate;
causing one or more cameras to capture images of the plurality of dies at the first locations;
determining, based on the images of the dies at the first locations, second locations for the plurality of dies associated with actual locations of the plurality of dies of the substrate;
determining differences between the first locations and the second locations; and
causing instructions for a digital lithography station to be generated or adjusted to change trace routes between the plurality of dies to compensate for the differences between the first locations and the second locations, wherein the trace routes run between connections on first sides of the plurality of dies that are opposite second sides of the plurality of dies that are mounted to the substrate.

10. The one or more non-transitory computer-readable media of claim 9, wherein the first locations comprise expected locations of alignment features on the plurality of dies.

11. The one or more non-transitory computer-readable media of claim 10, wherein the second locations comprise actual locations of the alignment features on the plurality of dies after being mounted to a substrate.

12. The one or more non-transitory computer-readable media of claim 9, wherein the one or more cameras comprises one or more lines scan cameras configured to perform a line scan capture of the images of the dies.

13. The one or more non-transitory computer-readable media of claim 12, wherein the images of the dies comprise a line scan along lines where the first locations indicate locations of alignment features on the plurality of dies.

14. The one or more non-transitory computer-readable media of claim 9, wherein the operations further comprise causing the one or more cameras to capture images of one or more global alignment features on the substrate to align the substrate.

15. A method of adjusting digital lithography to compensate for die placement errors, the method comprising:
receiving first locations for a plurality of dies on a substrate from a design file of the substrate;
causing one or more cameras to capture images of the plurality of dies at the first locations;
determining, based on the images of the dies at the first locations, second locations for the plurality of dies associated with actual locations of the plurality of dies of the substrate;
determining differences between the first locations and the second locations; and
causing instructions for a digital lithography station to be generated or adjusted to change trace routes between the plurality of dies to compensate for the differences between the first locations and the second locations, wherein the trace routes run between connections on first sides of the plurality of dies that are opposite second sides of the plurality of dies that are mounted to the substrate.

16. The method of claim 15, wherein the first locations indicate a bevel edge or die corner of one of the plurality of dies.

17. The method of claim 15, further comprising updating a universal metrology file with X/Y coordinates of the actual locations of the plurality of dies on the substrate.

18. The method of claim 15, wherein an image in the images of the plurality of dies comprises a field of view that captures a plurality of the first locations in the image.

19. The method of claim 15, further comprising maximizing fields of view of the one or more cameras such that a resolution of the one or more cameras is still able to accurately identify the second locations.

20. The method of claim 15, wherein the one or more cameras comprises a plurality of cameras that are spaced based on fields of view of the plurality of cameras.

* * * * *